US012660540B2

(12) United States Patent
Hasegawa et al.

(10) Patent No.: US 12,660,540 B2
(45) **Date of Patent: *Jun. 16, 2026**

(54) ETCHING METHOD USING OXYGEN-CONTAINING HYDROFLUOROCARBON

(71) Applicant: L'Air Liquide, Societe Anonyme pour l'Etude et l'Exploitation des Procedes Georges Claude, Paris (FR)

(72) Inventors: Tomo Hasegawa, Yokosuka (JP); Vladislav Gamaleev, Yokosuka (JP); Nicolas Gosset, Yokosuka (JP)

(73) Assignee: L'Air Liquide, Société Anonyme pour l'Etude et l'Exploitation des Procédés Georges Claude, Paris (FR)

( * ) Notice: Subject to any disclaimer, the term of this patent is extended or adjusted under 35 U.S.C. 154(b) by 236 days.

This patent is subject to a terminal disclaimer.

(21) Appl. No.: 18/218,814

(22) Filed: Jul. 6, 2023

(65) Prior Publication Data

US 2024/0290628 A1 Aug. 29, 2024

Related U.S. Application Data

(63) Continuation-in-part of application No. 18/114,134, filed on Feb. 24, 2023.

(51) Int. Cl.
*H10P 50/28* (2026.01)
*H10P 50/00* (2026.01)
*H10P 50/26* (2026.01)

(52) U.S. Cl.
CPC .......... *H10P 50/283* (2026.01); *H10P 50/268* (2026.01); *H10P 50/71* (2026.01); *H10P 50/73* (2026.01)

(58) Field of Classification Search
None
See application file for complete search history.

(56) References Cited

U.S. PATENT DOCUMENTS

| | | | |
|---|---|---|---|
| 5,626,775 | A | 5/1997 | Roberts et al. |
| 6,069,092 | A | 5/2000 | Imai et al. |
| 6,242,359 | B1 | 6/2001 | Misra et al. |
| 6,514,425 | B1 | 2/2003 | Sekiya et al. |

(Continued)

FOREIGN PATENT DOCUMENTS

| | | |
|---|---|---|
| EP | 1 498 941 | 1/2005 |
| JP | H10 223614 | 8/1998 |

(Continued)

OTHER PUBLICATIONS

Kim, J.-H. et al., SiO2 etching in inductively coupled plasmas using heptafluoroisopropyl methyl ether and 1,1,2,2-tetrafluoroethyl 2,2,2-trifluoroethyl ether, Applied Surface Science 508 (2020) 144787, 1-8.

(Continued)

*Primary Examiner* — Roberts P Culbert
(74) *Attorney, Agent, or Firm* — Yan Jiang

(57) ABSTRACT

An etching method for forming an aperture by selectively etching one or more silicon-containing films in a substrate using a patterned mask layer deposited on top of the one or more silicon-containing films comprises: mounting the substrate in a processing chamber; introducing an etching gas containing a vapor of an oxygen-containing hydrofluorocarbon into the processing chamber; converting the etching gas to a plasma; and allowing an etching reaction to proceed between the plasma and the one or more silicon-containing films so that the one or more silicon-containing films are selectively etched versus the patterned mask layer to form the aperture, wherein the oxygen-containing hydrofluorocarbon has a general formula $C_xH_yF_zO_n$, where $2 \leq x \leq 13$, $1 \leq y \leq 15$, $1 \leq z \leq 21$, $1 \leq n \leq 3$.

25 Claims, 9 Drawing Sheets

(56) References Cited

U.S. PATENT DOCUMENTS

| | | | |
|---|---|---|---|
| 6,540,930 B2 | 4/2003 | Kesari et al. | |
| 7,153,779 B2 | 12/2006 | Trapp | |
| 7,744,769 B2 | 6/2010 | Mouri et al. | |
| 10,424,489 B2 | 9/2019 | Matsuura | |
| 10,865,242 B2 * | 12/2020 | Jensen | C12N 15/85 |
| 2002/0096487 A1 | 7/2002 | Demmin et al. | |
| 2003/0001134 A1 | 1/2003 | Sekiya et al. | |
| 2003/0019841 A1 | 1/2003 | Kesari et al. | |
| 2005/0096238 A1 | 5/2005 | Isaki | |
| 2008/0274334 A1 | 11/2008 | Sekiya et al. | |
| 2017/0243756 A1 | 8/2017 | Matsuura | |
| 2019/0027368 A1 * | 1/2019 | Matsuura | H01L 21/31116 |
| 2019/0051454 A1 | 2/2019 | Suo et al. | |
| 2019/0345385 A1 | 11/2019 | Oomori et al. | |
| 2021/0193475 A1 | 6/2021 | Shino et al. | |
| 2022/0363989 A1 | 11/2022 | Kim et al. | |
| 2024/0290628 A1 * | 8/2024 | Hasegawa | H01L 21/31116 |

FOREIGN PATENT DOCUMENTS

| | | |
|---|---|---|
| JP | 2000 038 580 | 2/2000 |
| JP | 67 73110 | 10/2020 |
| WO | WO 1999 034429 | 7/1999 |
| WO | WO 2005 117082 | 12/2005 |
| WO | WO 2009 019219 | 2/2009 |
| WO | WO 2022 009 553 | 1/2022 |

OTHER PUBLICATIONS

Kim, et al., Plasma atomic layer etching of SiO2 and Si3N4 with heptafluoropropyl methyl ether (C3F7OCH3), J. Vac. Sci. Technol. A 38, 022606 (2020); https://doi.org/10.116/1.5134710, 7 pgs.

Kim, et al., Plasma Etching of SiO2 Using Heptafluoropropyl Methyl Ether and Perfluoropropyl vinyl Ether, ESC Journal of Solid State Science and Technology, 7 (11) Q218-Q221 (2018).

* cited by examiner

ETCHING METHOD USING OXYGEN-CONTAINING HYDROFLUOROCARBON

CROSS REFERENCE TO RELATED APPLICATIONS

The present application claims the benefit of U.S. application Ser. No. 18/114,134 filed Feb. 24, 2023, being incorporated herein by reference in its entirety for all purposes.

TECHNICAL FIELD

The present invention relates to plasma-etching methods using oxygen-containing hydrofluorocarbons based plasma etching chemistry as an etchant for anisotropic etching of $SiO_2$, $Si_3N_4$, stack of alternating $SiO_2$ and $Si_3N_4$ films, and other Si-containing films with high etch rates, high selectivity to a mask material and forming patterns with a defined profile in high aspect ratio structures, and, in particular, to the plasma-etching methods using oxygen-containing hydrofluorocarbons having a formula $C_xH_yF_zO_n$, where 2≤x≤10, 1≤y≤15, 1≤z≤21, 1≤n≤3, preferably, at least one oxygen atom is incorporated to the hydrofluorocarbon in an ether or carbonyl group.

BACKGROUND

Improvements in terms of control of deposited polymer film profile to finely etch patterns with a defined profile, high etch rate of silicon-containing (e.g., $SiO_2$, $Si_3N_4$ or alternating combination of $SiO_2$ and $Si_3N_4$) films, and high selectivity to mask material (e.g. amorphous carbon, amorphous silicon, doped amorphous carbon or amorphous silicon) are expected in high-aspect-ratio contact and channel etching for applications such as 3D NAND and DRAM memory fabrication.

Nowadays, silicon and silicon-based dielectrics are key components of any semiconductor device. Limitations in scaling down of transistors together with constant need in a considerable increase of memory capacity resulted in move of semiconductor industry from 2D type of structures to 3D integration. Production of semiconductor devices with vertical architectures, such as 3D NAND or DRAM, brings new fabrication challenges. One of the major problems related to the fabrication of 3D semiconductor devices (such as 3D NAND) is increasing height of elements, which requires etching of structures (apertures, holes, pillars, etc.) in dielectric with a high aspect ratio (ratio of height to width of structure). In more details, 3D NAND fabrication process requires deep etching of silicon oxide or alternated layers of silicon nitride and oxide, with well-defined profiles, and a soft landing onto the underlying (bottom) layer, which is a very challenging process even using state of the art devices. Therefore, etching process should feature high silicon oxide and nitride etch rates in order to maintain high production yield while etch rate of hard mask and bottom landing layers should be maintained as low as possible to avoid damage and various defects. The control of the hole etched profile (usually thin lateral size and straight vertical profile are desired) became recently one of the most important factors and challenges in fabrication of complex 3D semiconductor structures. To keep a defined profile it is required to minimize negative processing effects and defects such as bowing, twisting, or other pattern distortions. These defects are mainly coming from poor control of polymer film which is deposited during the etching process to protect parts of structure which are not intended to be etched (e.g., sidewall of hole or mask). The part of sidewall with not enough deposited polymer-based protection film may be distorted during high-aspect etching process leading to formation of mentioned above defects. Therefore, fine etching process tuning including precise control the polymer passivation conformality is necessary to ensure a good protection of the sidewalls while avoiding the clogging of the mask or an etch stop at the bottom of the holes during etching process.

Although there are numbers of prior arts for $SiO_2$ or $Si_3N_4$ etching by fluorocarbon gases, most of etching gas mixtures disclosed in prior art include molecular 02 gas. For example, U.S. Pat. No. 6,069,092 to Imai et al. discloses dry etching using fluorocarbon gas mixed with inert gas and oxygen. U.S. Pat. No. 5,626,775 A to Roberts et al. discloses etching of silicon dioxide or silicon nitride using trifluoroacetic acid and its oxygen-containing derivatives, and the etching chemical is mixed with oxygen. U.S. Pat. No. 7,153,779 B2 to Trapp et al. discloses etching of silicon oxide layer for high aspect ratio contact application using organic fluorocarbons including nitrogen-containing gases. U.S. Pat. No. 6,540,930 B2 to Kesari et al. discloses usage of perfluoroketones having 4 to 7 carbons mixed with oxygen to remove deposits and etch dielectrics and metals in a vapor reactor (non-plasma process).

Various oxygen-containing compounds have been used as etching gas to etch $SiO_2$ or $Si_3N_4$.

US 2019/0345385 A1 to Oomori et al. discloses usage of $CF_3—C_xH_yF_zO$ (where x=2 or 3; y=1, 2, 3, 4 or 5 and z=2x-1-y) and having one oxygen-containing three-membered ring, to etch silicon-based materials.

JP2000038580 to Kumagai et al. discloses usage of $CF_3CFHOCF_2H$ to etch silicon-based materials. That patent is pending and the target molecule is a specific formula and structure.

JP6773110B2 to Matsuura et al. discloses the usage of R—CF—O—$CH_2$—R (methylether-based fluorocarbons) to etch silicon oxide and prevent the neck growth (pattern diameter) of SiN mask.

WO2009019219A2 to Uenveren et al. discloses the applications of 0-containing fluorocarbon, hydrofluorocarbon to be used as etching gas for semiconductor etching or chamber cleaning, in which at least one 0-containing fluorocarbon and hydrofluorocarbon is selected.

U.S. Pat. No. 6,514,425B1 to Sekiya et al. discloses dry etching method of $SiO_2$ using $C_3HF_7O$, $C_4HF_9O$, and ether-containing molecules with C 2-6 are disclosed. US 20170243756A1 to Matsuura et al. discloses plasma etching method of $SiO_2$ and $Si_3N_4$ using hydrofluoroethers $C_mF_{2m+1}$—O—$CH_2$—R, wherein R represents a hydrogen atom or a fluoroalkyl group represented by $C_nF_{2n+1}$, and m and n represent positive integers that satisfy 1≤m≤3 and 3≤(m+n)≤4. $C_4H_3F_7O$ discloses in the Examples.

U.S. Pat. No. 7,744,769B2 to Mouri et al. discloses dry (thermal) etching of $SiO_2$ using OF bond containing hypofluorite, such as, $CF_3OF$, $CF_2(OF)_2$, $CF_3CF_2OF$, $CH_3COOF$, $(CF_3)_3COF$, $CF_2HCF_2OF$, $(CF_3CF_2)(CF_3)_2COF$, $CH_3OF$, $CFH_2OF$, $CF_2HOF$, $CF_3CF_2CF_2OF$, and $(CF_3)_2CFOF$.

US 2002/0096487 A1 to Demmin et al. discloses plasma etching and chamber cleaning methods using $C_3H_2F_2O_2$ and variety of carbonyl group containing molecules with specific structure defined by formula. US 2005/0096238A1 to Ryuichiro et al. chamber cleaning method using oxygen containing hydrofluorocarbons defined by formula $C_vH_xF_yO_z$ wherein v is an integer from 1 to 5, x is selected from 0 and an integer from 1 to 3, y is an integer from 1 to 12, and z is selected from 0 and 1.

US20080274334A1 to Sekiya et al. discloses plasma-etching method of $SiO_2$ and other semiconductor materials using hydrofluorocarbons containing ether group with number of C atoms in range 4-6 and (F/C) ratio of 1.9 or less.

U.S. Pat. No. 6,242,359 B1 to M Ashutosh discloses plasma etching of metals using oxygen-containing compounds $CH_2F_2O$, $CHF_3O$, $C_3H_2F_9O$, $C_2H_2F_4O_2$.

Kim et al. (2018 ECS J. Solid State Sci. Technol. 7 Q218) discloses plasma etching method of $SiO_2$ using heptafluoropropyl methyl ether (HFE-347mcc3, $C_4H_3F_7O$) and perfluoropropyl vinyl ether (PPVE, $CF_2{=}CFOCF_2CF_2CF_3$, $C_5F_{10}O$).

Kim et al. (Applied Surface Science Volume 508, 1 Apr. 2020, 144787) discloses $SiO_2$ etching in inductively coupled plasmas using heptafluoroisopropyl methyl ether ($C_4H_3F_7O$) and 1,1,2,2-tetrafluoroethyl 2,2,2-trifluoroethyl ether ($C_4H_3F_7O$).

Kim et al. (Journal of Vacuum Science & Technology A 38, 022606 (2020)) discloses atomic layer etching of $SiO_2$ and $Si_3N_4$ using heptafluoropropyl methyl ether ($C_4H_3F_7O$).

U.S. Ser. No. 10/424,489B2 to Matsuura Go discloses plasma etching of $SiO_2$ using molecules defined by following structure:

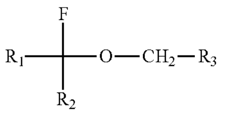

where $R_1$ represents a hydrogen atom, a fluorine atom, or a fluoroalkyl group $C_xF_{2x+1}$; $R_2$ represents a hydrogen atom, a fluorine atom, or a fluoroalkyl group $C_yF_{2y+1}$; and $R_3$ represents a hydrogen atom, a fluorine atom, or a fluoroalkyl group $C_zF_{2z+1}$, where x, y, and z are each an integer of at least 0 and not more than 3 and satisfy $1 \leq x+y+z \leq 3$, and $R_1$, $R_2$, and $R_3$ may be the same or different. Examples of hydrofluoroether gases represented by the above chemical structure formula include gases of $CF_3$—O—$CH_2C_2F_5$, $CF_3$—O—$CH_2$-n-$C_3F_7$, $CF_3$—O—$CH_2$-i-$C_3F_7$, $C_2F_5$—O—$CH_2$—$CF_3$, $C_2F_5$—O—$CH_2$—$C_2F_5$, n-$C_3F_7$—O—$CH_3$, and i-$C_3F_7$—O—$CH_3$.

EP1498941A2 to Ji et al. discloses method of plasma etching using an unsaturated oxygenated fluorocarbon having the formula $C_xF_yO_zR_q$ wherein R is a hydrogen atom, a hydrocarbyl group having a number of carbon atoms ranging from 1 to 5, a halocarbyl group having a number of carbon atoms ranging from 1 to 5, or a halohydrocarbyl group having a number of carbon atoms ranging from 1 to 5; x is a number ranging from 2 to 10; y is a number less than 2x-q, z is a number ranging from 1 to 2; and q is a number ranging from 0 to 1, and wherein the ratio of F atoms to C atoms is less than 2, provided that when x is a number ranging from 3 to 10, y is a number less than 2x-q, z is 1, and q is 0, the mixture further comprises an oxidizer wherein the ratio by volume of the oxidizer to the unsaturated oxygenated fluorocarbon ranges from 0:1 to 1.0:1.

WO 20221009553 A1 to M Kazuma discloses plasma etching method $Si_3N_4$ using a fluorine compound having 3 or less carbon atoms and having at least one of a carbon-oxygen double bond (carbonyl group) and an ether bond in the molecule.

WO1999034429A1 to Demmin et al. discloses method of plasma etching using low GWP compounds from the group consisting of F—CO—[$(CR,R_2)_m$—CO$]_n$—F and F—CO—$R_3$—CO—F, and wherein: m=0, 1, 2, 3, 4, or 5; n=1, $R_1{=}R_2{=}$H or F or $C_xH_yF_z$(x=1 or 2, y+z=2x+1), $R_3$="$CR_4$=(double bonding)$CR_5$" or "$R_6R_7$" or "C=C" or "C≡C" ($R_{4\sim7}$=H or F or $C_xH_yF_z$: x=1 or 2, y+z=2x+1).

US 20170243756A1 to Matsuura et al. discloses plasma etching method using hydrofluoroether accordingly to the formula $C_mF_{2m+1}$—O—$CH_2$—R where R is a hydrogen atom or fluoroalkyl group represented by $C_nF_{2n+1}$, where $1 \leq m \leq 3$, $3 \leq (m+n) \leq 4$.

US 2005/0096238A1 to Isaki et al. discloses chamber cleaning method using hydrofluorocarbon gas represented by formula $C_vH_xF_yO_z$, wherein v is an integer from 1 to 5, x is selected from 0 and an integer from 1 to 3, y is an integer from 1 to 12, and z is selected from 0 and 1.

WO 2005/117082A1 to Sekiya et al. disclosed dry etching gas comprising $C_4$-$C_6$ fluorine compound having ether bound or carbonyl group with F/C ratio of 1.9 or lower, provided that the compound is neither a fluorine compound having one cyclic ether bond and one carbon-carbon double bond nor a saturated fluorine compound having one carbonyl group.

US 2003/0019841 A1 to Kesari et al. discloses method of using of perfluoroketones as vapor reactor cleaning, etching, and doping gases in which reactive gases containing a perfluoroketone having 4 to 7 carbon atoms for removing unwanted deposits that build up in a vapor reactor, for etching dielectric and metallic materials in a vapor reactor, and for doping a material in a vapor reactor are described.

US 2003/0001134 A1 to Sekiya et al. discloses cleaning gasses and etching gases comprise at least one compound selected from the group consisting of FCOF, $CF_3OCOF$, $CF_3OCF_2OCOF$, $CF_3COF$, $C_3F_7COF$ or $CF_2(COF)_2$ and $O_2$ in the specific amount, and optionally other gases. The chamber cleaning gases and silicon-containing film etching gases of the present invention have a low global warming potential and hardly generate substances in the exhaust gases such as $CF_4$, etc., which are harmful to the environment and have been perceived as contributing to global warming.

WO 2022009553 A1 discloses etching selectivity of SiN to amorphous carbon (a-C), photoresist, $SiO_2$ with an etching gas containing a fluorine compound having 3 or less carbon atoms and at least one of a carbon-oxygen double bond (C=O) and/or an ether bond (C—O—C). Only $COF_2$ appears in the examples.

US 2017/0243756 to Matsuura discloses using $CF_3$—CHF—O—$CHF_2$ as an etching gas in Comparative Example 7 at paragraph [0075]. But, $CF_3$—CHF—O—$CHF_2$ shows "the selectivity ratio with respect to silicon nitride and the photoresist was small" (see Matsuurs, paragraph [0082]).

Even though it is possible to etch high aspect ratio structures using mixtures of common fluorocarbon ($CF_4$, $C_4F_6$, $C_4F_8$, $C_5F_8$) and hydrofluorocarbon ($CH_2F_2$, $CHF_3$, $CH_3F$ and $C_5HF_7$) vapors, there is still a need to improve the selectivity to the mask, the control of etched structures shape, and to increase the etch rate, which becomes more crucial during processing of high aspect ratio structures with decreased lateral size used in the state of art semiconductor devices (e.g., aspect ratio in range from 1 to 1000).

Accordingly, an objective of the present disclosure is to provide plasma-etching method that can improve selectivity to the mask, preserve critical dimensions of the pattern and provide better control over the shape of etched high aspect ratio structures while keeping high etch rate.

SUMMARY

Disclosed is an etching method for forming an aperture by selectively etching one or more silicon-containing films in a substrate using a patterned mask layer deposited on top of the one or more silicon-containing films, the method comprising:

mounting the substrate in a processing chamber;

introducing an etching gas containing a vapor of an oxygen-containing hydrofluorocarbon into the processing chamber;

converting the etching gas to a plasma; and allowing an etching reaction to proceed between the plasma and the one or more silicon-containing films so that the one or more silicon-containing films are selectively etched versus the patterned mask layer to form the aperture. The disclosed etching method may include one or more of the following features:

the oxygen-containing hydrofluorocarbon having a general formula $C_xH_yF_zO_n$, where $2 \le x \le 13$, $1 \le y \le 15$, $1 \le z \le 21$, $1 \le n \le 3$;

the oxygen-containing hydrofluorocarbon containing at least one oxygen atom in an ether group;

the oxygen-containing hydrofluorocarbon containing at least one oxygen atom in a carbonyl group;

the oxygen-containing hydrofluorocarbon having at least one ether group represented by one of following formulas:

$$R_1—CO—O—CH_2—R_1, \quad R_2—CH_2—O—CH_2—R_2 \quad \text{or} \quad R_3—CHF—O—CF_2—R_1,$$

wherein $R_1$ is H, F, $C_xH_{2x+2-z}F_z$ or $C_xF_{2x+2}$; $R_2$ is H, $C_xH_{2x+2-z}F_z$ or $C_xF_{2x+2}$; $R_3$ is F, $C_xH_{2x+2-z}F_z$ or $C_xF_{2x+2}$, where $2 \le x \le 3$ and $1 \le z \le 3$;

the oxygen-containing hydrofluorocarbon having at least one ether group represented by the following formula:

$$R_1—CO—O—CH_2—R_1,$$

wherein $R_1$ is H, F, $C_xH_{2x+2-z}F_z$ or $C_xF_{2x+2}$, where $2 \le x \le 3$ and $1 \le z \le 3$;

the oxygen-containing hydrofluorocarbon having at least one ether group represented by the following formula:

$$R_2—CH_2—O—CH_2—R_2,$$

wherein $R_2$ is H, $C_xH_{2x+2-z}F_z$ or $C_xF_{2x+2}$, where $2 \le x \le 3$ and $1 \le z \le 3$;

the oxygen-containing hydrofluorocarbon having at least one ether group represented by the following formula:

$$R_3—CHF—O—CF_2—R_1,$$

wherein $R_1$ is H, F, $C_xH_{2x+2-z}F_z$ or $C_xF_{2x+2}$; $R_3$ is F, $C_xH_{2x+2-z}F_z$ or $C_xF_{2x+2}$, where $2 \le x \le 3$ and $1 \le z \le 3$;

the oxygen-containing hydrofluorocarbon being selected from $C_4H_4F_6O$, $C_4H_2F_6O_2$, $C_3H_2F_6O$, $C_2H_2F_4O$, $C_2HF_3O$, $C_3H_5F_3O$, $C_2H_4F_2O$, $C_4H_6F_4O$, $C_5H_4F_8O$, $C_5HF_{11}O$, $C_2H_3F_3O$, or their isomers;

the oxygen-containing hydrofluorocarbon being $C_3H_2F_6O$, CAS No.: 57041-67-5;

the oxygen-containing hydrofluorocarbon being $C_3H_2F_6O$, CAS No.: 84011-06-3;

the oxygen-containing hydrofluorocarbon being $C_3H_2F_6O$, CAS No.: 920-66-1;

the oxygen-containing hydrofluorocarbon being $C_4H_4F_6O$ or its isomers;

the oxygen-containing hydrofluorocarbon being $C_4H_4F_6O$, CAS No. 382-34-3;

the oxygen-containing hydrofluorocarbon being $C_4H_4F_6O$, CAS No. 333-36-8;

the oxygen-containing hydrofluorocarbon being $C_4H_2F_6O_2$ or its isomers;

the oxygen-containing hydrofluorocarbon being $C_4H_2F_6O_2$, CAS No. 407-38-5;

the etching gas further including a vapor of a fluorocarbon or hydrofluorocarbon selected from $CF_4$, $C_2F_6$, $C_3F_6$, $C_4F_6$, $C_4F_8$, $C_5F_8$, $C_5F_{10}$, $C_6F_{12}$, $C_7F_{14}$, $C_8F_{16}$, $CH_2F_2$, $CH_3F$, $CHF_3$, $C_5HF_7$, $C_3H_2F_6$, $C_3H_4F_2$, $C_3F_2H_4$, $C_4H_2F_6$, $C_4H_3F_7$, $C_3HF_4N$, $CF_3I$, $C_3F_7I$, $C_4F_9I$, $C_4H_9F_3Si$, $C_5H_9F_5Si$ or combinations thereof;

the etching gas further including an oxidizing gas selected from $O_2$, $O_3$, CO, $CO_2$, SO, $SO_2$, FNO, $N_2$, NO, $N_2O$, $NO_2$, $H_2O$, COS or combinations thereof;

the etching gas further including an inert gas selected from He, Ar, Xe, Kr or Ne;

the etching gas further including an additional gas selected from $H_2$, $SF_6$, $NF_3$, $N_2$, $NH_3$, $Cl_2$, $BCl_3$, $Br_2$, $F_2$, HBr, HCl, $PF_3$ or combinations thereof;

the one or more silicon-containing films comprising a layer of $Si_aO_bH_cC_dN_e$, where a>0, b, c, d and e≥0, selected from silicon oxide, silicon nitride, crystalline Si, poly-silicon, polycrystalline silicon, amorphous silicon, low-k SiCOH, SiOCN, SiC, SiON, or a layer of alternating silicon oxide and silicon nitride (ONON) films or alternating silicon oxide and polysilicon (OPOP) films;

the silicon-containing film is a silicon oxide film, a silicon nitride film or a stack of alternating silicon oxide film and silicon nitride film;

an aspect ratio of the aperture ranging from approximately 5:1 to approximately 500:1;

an aspect ratio of the aperture ranging from approximately 20:1 to approximately 400:1;

an aspect ratio of the aperture having an aspect ratio greater than 50:1;

an aspect ratio of the aperture being above 5;

an aspect ratio of the aperture being above 10;

an aspect ratio of the aperture being above 20;

the aperture having a diameter ranging from approximately 5 nm to approximately 500 nm;

the aperture having a diameter less than 100 nm;

a selectivity of the silicon oxide film versus the silicon nitride film in the layer of ONON films ranging from 1:20 to 20:1;

a selectivity of the silicon oxide film versus the silicon nitride film in the layer of ONON films ranging from 1:10 to 10:1;

a selectivity of the silicon oxide film versus the silicon nitride film in the layer of ONON films ranging from 1:5 to 5:1;

a selectivity of the silicon oxide film versus the silicon nitride film in the layer of ONON films ranging from 1:2 to 2:1; and a selectivity of the silicon oxide film versus the silicon nitride film in the layer of ONON films being close to approximately 1.

Also disclosed is an etching method for forming an aperture by selectively etching a silicon oxide film in a substrate using a patterned mask layer deposited on top of the silicon oxide film, the method comprising:

mounting the substrate in a processing chamber;

introducing an etching gas containing an oxygen-containing hydrofluorocarbon $C_3H_2F_6O$ vapor into the processing chamber;

converting the etching gas to a plasma; and allowing an etching reaction to proceed between the plasma and the silicon oxide film so that the silicon oxide film is selectively etched versus the patterned mask layer to form the aperture. The disclosed etching method may include one or more of the following features:

the oxygen-containing hydrofluorocarbon $C_3H_2F_6O$ being $C_3H_2F_6O$, CAS No.: 57041-67-5;

the oxygen-containing hydrofluorocarbon $C_3H_2F_6O$ being $C_3H_2F_6O$, CAS No.: 84011-06-3;

the oxygen-containing hydrofluorocarbon $C_3H_2F_6O$ being $C_3H_2F_6O$, CAS No.: 920-66-1;

the etching gas further including a vapor of a fluorocarbon or hydrofluorocarbon selected from $CF_4$, $C_2F_6$, $C_3F_6$, $C_4F_6$, $C_4F_6$, $C_5F_8$, $C_5F_{10}$, $C_6F_{12}$, $C_7F_{14}$, $C_8F_{16}$, $CH_2F_2$, $CH_3F$, $CHF_3$, $C_5HF_7$, $C_3H_2F_6$, $C_3H_4F_2$, $C_3F_2H_4$, $C_4H_2F_6$, $C_4H_3F_7$, $C_3HF_4N$, $CF_3I$, $C_3F_7I$, $C_4F_9I$, $C_4H_9F_3Si$, $C_5H_9F_5Si$ or combinations thereof;

the etching gas further including an oxidizing gas selected from $O_2$, $O_3$, CO, $CO_2$, SO, $SO_2$, FNO, $N_2$, NO, $N_2O$, $NO_2$, $H_2O$, COS or combinations thereof;

the etching gas further including an inert gas selected from He, Ar, Xe, Kr or Ne;

the etching gas further including an additional gas selected from $H_2$, $SF_6$, $NF_3$, $N_2$, $NH_3$, $Cl_2$, $BCl_3$, $Br_2$, $F_2$, HBr, HCl, $PF_3$ or combinations thereof;

an aspect ratio of the aperture ranging from approximately 5:1 to approximately 500:1;

an aspect ratio of the aperture ranging from approximately 20:1 to approximately 400:1;

an aspect ratio of the aperture having an aspect ratio greater than 50:1;

an aspect ratio of the aperture being above 5;

an aspect ratio of the aperture being above 10;

an aspect ratio of the aperture being above 20;

the aperture having a diameter ranging from approximately 5 nm to approximately 500 nm; and the aperture having a diameter less than 100 nm.

High aspect ratio etching process allows etching of target material(s) in a workpiece not covered by a mask, preferentially in the vertical direction, resulting in forming vertical apertures in the target material(s) that have high aspect ratio. Preferential etching in the vertical direction forming an etched structure is achieved by balancing between deposition and etching processes. Isotropic deposition of polymer over the entire workpiece allows forming passivation on the sidewall of etched aperture and avoid lateral etching. While etching process consists of two components: anisotropic directional etching by ion bombardment and isotropic chemical based etching by reactive species. In this case, the sidewall passivation of the etched structure, as well as the mask, prevents lateral etching and mask erosion, which enables a directional vertical etching of the high aspect ratio structure keeping lateral dimensions close to initials. The directional etching is achieved by directional ion bombardment (from top to bottom) of the passivation polymer at the bottom of the etched structure avoiding bombardment of polymer on the sidewalls, which damages polymer on the bottom allowing chemical reactions to proceed preferentially at the bottom of the structure resulting in the formation of volatile byproducts and material removal preferentially of the bottom surface. Commonly used fluorocarbon and hydrofluorocarbon gases allow achieving relatively high anisotropic etch rate, when most of technical problems come from the poor control of growth of polymer along the sidewalls and poor selectivity to the mask, resulting in profile distortions. Moreover, for the future generations of semiconductor devices, the aspect ratio increase results in a significant loss of etch rate when common etching gas mixture is used, bringing needs for the development of new etching chemistries capable of keeping high etch rate with further increase of the aspect ratio. The present invention aims to improve the profile control while keeping fast etch rate in high aspect ratio structures. The present invention concludes that the addition of oxygen-containing hydrofluorocarbons to a process gas mixture allows significantly increasing etch rate of $SiO_2$, SiN and other Si-containing materials and improving selectivity of the target material(s) to the mask.

Specifically, the present invention discloses plasma etching method comprising plasma etching of a workpiece containing dielectric materials (e.g. silicon oxide) as a processing target film and a non-processing target film (e.g., amorphous carbon mask) using a gas mixture consisting at least, but not exclusively, of a vapor of one oxygen-containing hydrofluorocarbon compound, optionally one fluorocarbon and/or a hydrofluorocarbon, optionally an inert gas, and optionally an oxidizing gas as a processing gas mixture in order to form a high aspect ratio structure.

In the disclosed plasma etching methods, the plasma processing gas is a mixture a vapor of oxygen-containing hydrofluorocarbon compound, optionally an inert gas, optionally an oxidizing gas, and optionally a fluorocarbon and/or hydrofluorocarbon, and. Moreover, the fluorocarbon gas is preferably a gas of a compound represented by the composition formula $CF_4$, $C_2F_6$, $C_3F_6$, $C_4F_6$, $C_4F_8$, $C_5F_8$, $C_5F_{10}$, $C_6F_{12}$, $C_7F_{12}$, $C_8F_{16}$ to improve the etching of the target processing thin film dielectric and/or improve the selectivity to non-target thin film. The hydrofluorocarbon is preferably a gas of a compound represented by the composition formula $CH_2F_2$, $CH_3F$, $CHF_3$, $C_5HF_7$, $C_3H_2Fe$, $C_3F_2H_4$, $C_4H_2Fe$, $C_4H_3F_7$ $C_3HF_4N$, to improve etching of the target processing thin film dielectric and improve the selectivity to non-target thin film. The oxygen-containing hydrofluorocarbon compound in the disclosed methods may have a formula $C_xH_yF_zO_n$, where $2 \leq x \leq 10$, $1 \leq y \leq 15$, $1 \leq z \leq 21$, $1 \leq n \leq 3$, preferably, at least one oxygen atom is incorporated to the molecule in an ether group or in a carbonyl group. More preferentially the disclosed oxygen-containing hydrofluorocarbon compound may contain at least one ether group that may specifically be represented by formula $R_1$—CO—O—$CH_2$—$R_1$, $R_2$—$CH_2$—O—$CH_2$—$R_2$ or $R_3$—CHF—O—$CF_2$—$R_1$, wherein $R_1$ is H, F, $C_xH_{2x+2-z}F_z$ or $C_xF_{2x+2}$; $R_2$ is H, $C_xH_{2x+2-z}F_z$ or $C_xF_{2x+2}$; $R_3$ is F, $C_xH_{2x+2-z}F_z$ or $C_xF_{2x+2}$, where $2 \leq x \leq 3$ and $1 \leq z \leq 3$. More preferentially the disclosed oxygen-containing hydrofluorocarbon is selected from the group $C_4H_4F_6O$, $C_4H_2F_6O_2$, $C_3H_2F_6O$, $C_2H_2F_4O$, $C_2HF_3O$, $C_3H_3F_3O$, $C_2H_4F_2O$, $C_4H_6F_4O$, $C_5H_4F_8O$, $C_5HF_{11}O$, $C_2H_3F_3O$, including their isomers, and combinations thereof. More preferentially the disclosed oxygen-containing hydrofluorocarbon is selected from $C_3H_2F_6O$, $C_4H_4F_6O$, $C_4H_2F_6O_2$ or their isomers.

Notation and Nomenclature

The following detailed description and claims utilize a number of abbreviations, symbols, and terms, which are generally well known in the art, and include:

As used herein, the indefinite article "a" or "an" means one or more.

As used herein, "about" or "around" or "approximately" in the text or in a claim means ±10% of the value stated.

As used herein, "room temperature" in the text or in a claim means from approximately 20° C. to approximately 25° C.

The term "substrate" refers to a material or materials on which a process is conducted. The substrate may refer to a wafer having a material or materials on which a process is conducted. The substrates may be any suitable wafer used in semiconductor, photovoltaic, flat panel, or LCD-TFT device manufacturing. The substrate may also have one or more layers of differing materials already deposited upon it from previous manufacturing steps. For example, the wafers may include silicon layers (including, but not limited to, crystalline, amorphous, porous, etc.), silicon containing layers (including, but not limited to, $SiO_2$, SiN, SiON, SiCOH, etc.), metal or metal containing layers (including, but not limited to, copper, cobalt, ruthenium, tungsten, platinum, palladium, nickel, ruthenium, gold, etc.) or combinations thereof. Furthermore, the substrate may be planar or patterned. The substrate may be an organic patterned lodinated carbon layer film. The substrate may include layers of oxides that are used as dielectric materials in field effect transistor (FET) such as FinFET, MOFSET, GAAFET (Gate all-around FET), Ribbon-FET, Nanosheet, Forksheet FET, Complementary FET (CFET), MEMS, 3D NAND, MIM, DRAM, or FeRam device applications (for example, $ZrO_2$ based materials, $HfO_2$ based materials, $TiO_2$ based materials, rare earth oxide based materials, ternary oxide based materials, etc.) or nitride-based films (for example, TaN, TiN, NbN) that are used as electrodes. The substrate may include layers of alternating oxides (e.g., SiO) and nitrides (e.g., SiN). One of ordinary skill in the art will recognize that the terms "film" or "layer" used herein refer to a thickness of some material laid on or spread over a surface and that the surface may be a trench or a line. Throughout the specification and claims, the wafer and any associated layers thereon are referred to as substrates. The substrate may be any solid that has functional groups on its surface that are prone to react with the reactive head of a self-assembled monolayer (SAM), and may include without limitation 3D objects or powders.

The term "wafer" or "patterned wafer" refers to a wafer that has a stack of films on a substrate, at least the top-most film the stack of the films has topographic features or patterns that have been created in steps prior to etch and the patterned top-most film on is formed for pattern etch.

The term "processing" as used herein includes patterning, exposure, development, etching, deposition, cleaning, and/or removal of by-products, as required in forming a described structure.

The term of "deposit" or "deposition" refers to a series of processes where materials at atomic or molecular levels are deposited on a wafer surface or on a substrate from a gas state (vapor) to a solid state as a thin layer. Chemical reactions are involved in the process, which occur after creation of a plasma of the reacting gases or activation of the reacting gases by heat. The plasma may be capacitively coupled plasma (CCP), Inductively coupled plasma (ICP), electron cyclotron resonance (ECR) plasma, or a microwave plasma, but is not limited to. Suitable commercially available plasma etching chambers include but are not limited to the Lam Research Dual CCP reactive ion etcher Dielectric etch product family sold under the trademark Flex™ or the Tokyo Electron Tactras™ or Episode™ UL. The non-plasma exposure step may be performed in a different chamber than the plasma exposure step.

The term "aspect ratio" refers to a ratio of the height of a trench (or aperture) to the width of the trench (or the diameter of the aperture).

The term "high aspect ratio (HAR)" refers to an aspect ratio ranging from approximately 1:1 to approximately 500:1, preferably from approximately 20:1 to approximately 400:1.

The term "high aspect ratio etching" refers to the formation of a hole pattern in a target film by plasma etching method when aspect ratio of formed hole structures is exceeding value of 5.

Note that herein, the terms "film" and "layer" may be used interchangeably. It is understood that a film may correspond to, or related to a layer, and that the layer may refer to the film. Furthermore, one of ordinary skill in the art will recognize that the terms "film" or "layer" used herein refer to a thickness of some material laid on or spread over a surface and that the surface may range from as large as the entire wafer to as small as a trench or a line.

Note that herein, the terms "aperture", "via", "hole", "trench" and "structure" may be used interchangeably to refer to an opening formed in a semiconductor structure.

As used herein, the abbreviation "NAND" refers to a "Negative AND" or "Not AND" gate; the abbreviation "2D" refers to 2 dimensional gate structures on a planar substrate; the abbreviation "3D" refers to 3 dimensional or vertical gate structures, wherein the gate structures are stacked in the vertical direction.

Note that herein, the terms "etch gas" and "etchant" may be used interchangeably when the etch gas is in a gaseous state at room temperature and ambient pressure. It is understood that an etch gas may correspond to, or be related to an etchant, and that the etchant may refer to the etch gas.

The terms "dope" or "doping" is used interchangeably to the process of incorporation of one or more elements into a film through various methods where that element may be chemically bond or physically bond, and the process of intentionally incorporating atoms of different elements into the film composition. The element(s) may be doped interstitial or substitutional within the film.

The standard abbreviations of the elements from the periodic table of elements are used herein. It should be understood that elements may be referred to by these abbreviation (e.g., Si refers to silicon, N refers to nitrogen, O refers to oxygen, C refers to carbon, H refers to hydrogen, F refers to fluorine, etc.).

The unique CAS registry numbers (i.e., "CAS") assigned by the Chemical Abstract Service are provided to identify the specific molecules disclosed.

As used herein, the term "hydrofluorocarbon" refers to a saturated or unsaturated function group containing exclusively carbon, fluoride and hydrogen atoms.

As used herein, the term "fluorocarbon" refers to a saturated or unsaturated function group containing exclusively fluoride and hydrogen atoms.

As used herein, the term "alkyl group" refers to saturated functional groups containing exclusively carbon and hydrogen atoms. An alkyl group is one type of hydrocarbon. Further, the term "alkyl group" refers to linear, branched, or cyclic alkyl groups. Examples of linear alkyl groups include without limitation, methyl groups, ethyl groups, propyl groups, butyl groups, etc. Examples of branched alkyls groups include without limitation, t-butyl. Examples of cyclic alkyl groups include without limitation, cyclopropyl groups, cyclopentyl groups, cyclohexyl groups, etc.

Ranges may be expressed herein as from about one particular value, and/or to about another particular value. When such a range is expressed, it is to be understood that another embodiment is from the one particular value and/or to the other particular value, along with all combinations within said range. Any and all ranges recited herein are inclusive of their endpoints (i.e., x=1 to 4 or x ranges from 1 to 4 includes x=1, x=4, and x=any number in between), irrespective of whether the term "inclusively" is used.

Reference herein to "one embodiment" or "an embodiment" means that a particular feature, structure, or characteristic described in connection with the embodiment may be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

"Comprising" in a claim is an open transitional term that means the subsequently identified claim elements are a nonexclusive listing (i.e., anything else may be additionally included and remain within the scope of "comprising"). "Comprising" is defined herein as necessarily encompassing the more limited transitional terms "consisting essentially of" and "consisting of"; "comprising" may therefore be replaced by "consisting essentially of" or "consisting of" and remain within the expressly defined scope of "comprising".

"Providing" in a claim is defined to mean furnishing, supplying, making available, or preparing something. The step may be performed by any actors in the absence of express language in the claim to the contrary.

BRIEF DESCRIPTION OF THE DRAWINGS

For a further understanding of the nature and objects of the present invention, reference should be made to the following detailed description, taken in conjunction with the accompanying drawings, in which like elements are given the same or analogous reference numbers and wherein.

DESCRIPTION OF PREFERRED EMBODIMENTS

Disclosed are plasma etching methods using new oxygen-containing hydrofluorocarbons based plasma etching chemistry as an etchant for anisotropic etching of silicon oxide, silicon nitride, a stack of alternating silicon oxide and silicon nitride films, and other Si-containing films with high etch rates (ERs), high selectivity to a mask material (e.g., amorphous carbon or doped amorphous carbon), and forming patterns with a defined profile in high aspect ratio structures. The disclosed plasma etching methods may be used in high aspect ratio etching processes for fabrication of 3D NAND structures, contact holes, DRAM capacitors etc., but not limited to those applications. The disclosed plasma etching methods are methods of processing a workpiece including one or more target etching processing films (e.g., silicon oxide, silicon nitride or combinations thereof) and non-processing target films (e.g., amorphous carbon, amorphous silicon, doped amorphous carbon, doped amorphous silicon, metals), when a processing gas mixture including at least one oxygen-containing hydrofluorocarbon (e.g., $C_4H_4F_6O$, $C_4H_2F_6O_2$), optionally at least one inert gas (e.g., He, Ar, Kr, Xe, Ne), optionally an oxidizing gas (e.g., $O_2$, $O_3$, CO, $CO_2$, SO, $SO_2$, FNO, NO, $NO_2$, $H_2O$), optionally a fluorocarbon and/or hydrofluorocarbon gas (e.g., $C_4F_6$, $C_4F_6$, $CH_2F_2$) and optionally an additional gas (e.g., $SF_6$, $H_2$, $Cl_2$, $F_2$, $Br_2$, HCl, HBr) is used for the formation of reactive species and ions in the plasma. The workpiece could be any type of targets as long as it may be processed by plasma etching.

Herein the term "high aspect ratio etching" refers to the formation of a pattern with apertures in a target film by plasma etching method when aspect ratio (ratio of height to width) of formed apertures exceeds a value of 5. High anisotropy of the plasma etching process is required to achieve high aspect ratio of the etched structure. In order to achieve anisotropy of the process (directional etch in the vertical direction when lateral etching is minimized), typically formation of a polymer on the sidewall of the etched structure is used. The formation of the polymer preferentially on the sidewall of the etched structure is achieved by competition between etching process (removal of the polymer) and deposition process (formation of the polymer). Presence of directional (in vertical direction) etching by ion bombardment allows removing the polymer on the horizontal surfaces more effectively than on vertical surfaces, resulting in promotion of the formation of the polymer on vertical sidewalls. Furthermore, fine tuning of the balance between etching and deposition processes allows achieving preferential etching of the workpiece in the vertical direction when etching in lateral direction is suppressed, thereby preserving horizontal dimensions of the etched structure.

Figure 1A:
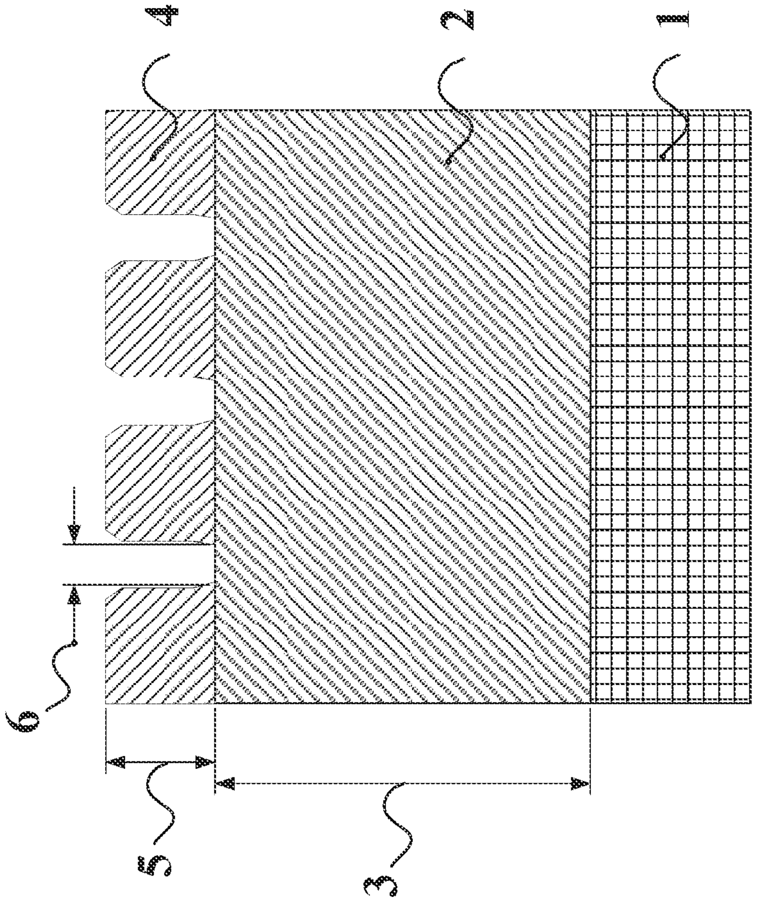
FIG. 1A is a cross-sectional view of a block diagram depicting an exemplary initial structure of a workpiece used in the disclosed plasma etching process.

FIG. 1A is a cross-sectional view of a block diagram depicting an exemplary initial structure of a workpiece used in the disclosed plasma etching process. As shown, silicon wafer 1 having target plasma etching film 2 formed on the top of silicon wafer 1. Silicon wafer 1 may be a monocrystalline silicon wafer. Target plasma etching film 2 may be silicon oxide, silicon nitride or combinations thereof, such as, a stack of alternating silicon oxide and silicon nitride films. The thickness of target plasma etching film 2 is shown as numeral 3. On the top of target plasma etching film 2 is non-target etching film 4, which is patterned, having a thickness shown as numeral 5 and a bottom diameter of opening pattern shown as numeral 6. Non-target etching film 4 may be a patterned mask layer. Non-target etching film 4 may be a patterned film of amorphous carbon, amorphous silicon, doped amorphous carbon, doped amorphous silicon, metals or the like.

Figure 1B:
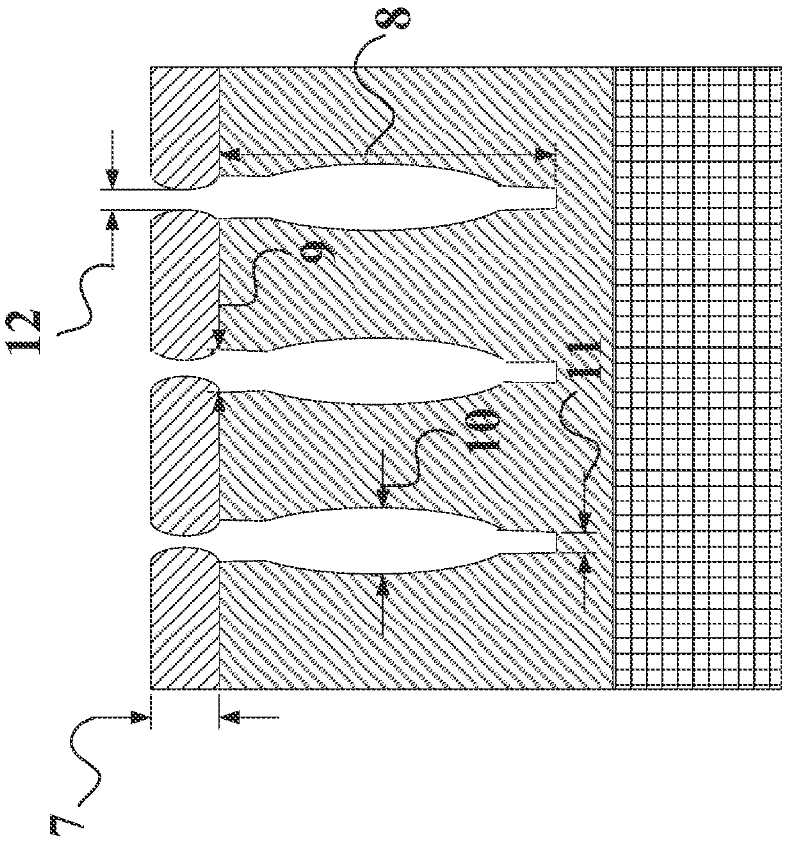
FIG. 1B is a cross-sectional view of a block diagram depicting an exemplary etched profile of a workpiece.

FIG. 1B shows a cross-sectional view of a block diagram depicting an exemplary etched profile of a workpiece done by an etching process, in which apertures are formed in target plasma etching film 2 with high aspect ratio. Numeral 7 is a thickness of non-target etching film 4 after the etching process. Numeral 8 is a depth of high aspect ratio apertures in target plasma etching film 2. Numeral 9 is a diameter of the top of the high aspect ratio apertures in target plasma etching film 2 (hereafter "top CD"). Numeral 10 is a diameter of the widest part of the high aspect ratio apertures in target plasma etching film 2 (hereafter "bow CD"). Numeral 11 is a diameter of the bottom of the high aspect ratio apertures in target plasma etching film 2 (hereafter "bottom CD"). Term "neck CD" corresponds to the thinnest part of the etched aperture. In the present disclosure, a part of the etched aperture with smallest diameter in the mask area (numeral 12).

To determine etching performances, blanket, trench, hole or aperture pattern wafers have been examined where the layers to be etched are deposited on a Si substrate defining an initial film thickness. The wafers are etched using a plasma composed of a fluorocarbon or hydrofluorocarbon and additional gas based mixture. Etched layers are partially or totally removed to produce a second defined film thickness. The difference between the first and second defined thicknesses reveals the amount of etched material. The ratio of etched material amount in between different layers (e.g., bulk material, mask, sacrificial layer) defines selectivity. Pattern lateral dimensions (e.g., width for trenches or diameter for holes) at different depths (top, neck, bow, and bottom) are also evaluated. The difference in diameter between etched and non-etched patterns, as well as change in circularity, (in the case of hole pattern) define the level of profile quality control.

In some cases, it is possible to achieve so-called infinite selective etching, when the etching target material is etched while the thickness of non-etching materials remains unchanged or increased (polymer deposition preserving them from etching) after the retching process. Typically, the infinite selectivity comes at cost of lower etch rate comparing to processes with lower selectivity.

<Processing Gases>

In the disclosed etching method, selection of process gases and ratio of each gas concentrations in a process gas mixture is required to achieve balance between deposition process for protection of vertical surfaces (hereafter "passivation") and etching process for anisotropic removal of the target material. Typically, combinations of process gases are used, where each gas type is playing different role. The process gas mixture include the disclosed oxygen-containing hydrofluorocarbon gas used as etching gas, at least one inert gas (e.g., $N_2$, He, Ar, Kr, Xe, Ne) for generation of plasma and promotion of ion bombardment, an oxidizing gas (e.g., $O_2$, CO, $CO_2$) to promote isotropic etching and surface or gas phase chemical reactions, and at least one fluorocarbon or hydrofluorocarbon gas (e.g., $C_4F_6$, $C_4F_6$, $CF_4$, $CH_2F_2$) to promote both anisotropic etching process of target film and vertical surface and/or non-target film passivation.

Each gas in the process gas mixture is provided at greater than 95% v/v purity, preferably at greater than 99.99% v/v purity, and more preferably at greater than 99.999% v/v purity. Each gas in the process gas mixture contains less than 5% by volume trace gas impurities, with less than 150 ppm by volume of impurity gases, such as $H_2O$, contained in said trace gaseous impurities. Preferably, the water content in the plasma etching gas is less than 20 ppm by weight. The purified product may be produced by distillation and/or passing the gas or liquid through a suitable adsorbent, such as a 4A molecular sieve.

<Hydrofluorocarbon and Fluorocarbon Gas>

Examples of hydrofluorocarbon and/or fluorocarbon gases that may be used in the disclosed plasma etching method include but not limited to compounds $CF_4$, $C_2F_6$, $C_3F_6$, $C_4F_6$, $C_4F_8$, $C_5F_8$, $C_5F_{10}$, $C_6F_{12}$, $C_7F_{12}$, $C_8F_{16}$, $CF_3I$, $C_3F_7I$, $C_4F_9I$, $C_4H_9F_3Si$, or $C_5H_9F_5Si$. Examples of hydrofluorocarbon gases that may be used in the plasma etching process include but not limited to compounds $CH_2F_2$, $CH_3F$, $CHF_3$, $C_5HF_7$, $C_3H_2F_6$, $C_3F_2H_4$, $C_4H_2F_6$, $C_4H_3F_7$ and $C_3HF_4N$. Under the plasma conditions, various reactive species and ions are generated directly by dissociation of these above-mentioned fluorocarbon and hydrofluorocarbon compounds and chemical reactions through interaction between species presented in the gas phase. Plasma etching may be achieved with any of compounds represented by the above-mentioned compounds, when the mentioned compounds are used individually or mixed with each other. Depending on the structure of individual compound, it may promote either etching performance including increase of etching speed of particular target materials, or passivation during high aspect ratio etching process. In particular, a mixture of $C_4F_6$ and $C_4F_6$ is one of commonly used mixtures because $C_4F_6$ is effective to promote passivation and $C_4F_6$ is effective to increase the etching speed resulting in a high anisotropy of etching processes. Furthermore, hydrofluorocarbon gases, such as $CH_2F_2$, may be added to increase the etching speed of silicon nitride film and/or further promote polymer deposition if it is desired.

The disclosed hydrofluorocarbon and fluorocarbon gases are provided at greater than 95% v/v purity, preferably at greater than 99.99% v/v purity, and more preferably at greater than 99.999% v/v purity. The disclosed hydrofluorocarbon and fluorocarbon gases contain less than 5% by volume trace gas impurities, with less than 150 ppm by volume of impurity gases, such as $N_2$ and/or $H_2O$ and/or $CO_2$, contained in said trace gaseous impurities. Preferably, the water content in the plasma etching gas is less than 20 ppm by weight. The purified product may be produced by distillation and/or passing the gas or liquid through a suitable adsorbent, such as a 4A molecular sieve.

The hydrofluorocarbon and fluorocarbon gases used herein may contain between 0.01% v/v and 99.99% v/v of its isomers, particularly when the isomer mixture provides improved process parameters or if isolation of the target isomer is too difficult or expensive. The mixture of isomers may also reduce the need for two or more gas lines to the reaction chamber.

<Oxygen-Containing Hydrofluorocarbon Gas>

The disclosed oxygen-containing hydrofluorocarbon gas used in the disclosed methods may have a formula $C_xH_yF_zO_n$, where 2≤x≤10, 1≤y≤15, 1≤z≤21, 1≤n≤3, preferably, at least one oxygen atom is incorporated to the molecule in an ether group or in a carbonyl group.

The disclosed oxygen-containing hydrofluorocarbon gas may contain at least one ether group or in a carbonyl group that may specifically be represented by formula $R_1$—CO—O—$CH_2$—$R_1$, $R_2$—$CH_2$—O—$CH_2$—$R_2$ or $R_3$—CHF—O—$CF_2$—$R_1$, wherein $R_1$ is H, F, $C_xH_{2x+2-z}F_z$ or $C_xF_{2x+2}$; $R_2$ is H, $C_xH_{2x+2-z}F_z$ or $C_xF_{2x+2}$; $R_3$ is F, $C_xH_{2x+2-z}F_z$ or $C_xF_{2x+2}$, where 2≤x≤3 and 1≤z≤3.

Exemplary disclosed oxygen-containing hydrofluorocarbon gas may include without limitation, $C_4H_4F_6O$, $C_4H_2F_6O_2$, $C_3H_2F_6O$, $C_2H_2F_4O$, $C_2HF_3O$, $C_3H_5F_3O$, $C_2H_4F_2O$, $C_4H_6F_4O$, $C_5H_4F_8O$, $C_5HF_{11}O$, $C_2H_3F_3O$ and their isomers.

Examples of $C_4H_4F_6O$ isomers include 1,1,2,3,3,3-Hexafluoropropyl methyl ether (CAS No.: 382-34-3), Bis(2,2,2-trifluoroethyl) Ether (CAS No.: 333-36-8), 2,2,3,4,4,4-Hexafluoro-1-butanol (CAS No.: 382-31-0), 1,1,1,2,3,3-hexafluoroisopropyl methyl ether (CAS No.: 13171-18-1), 1,1,1,3,3,3-Hexafluoro-2-methyl-2-propanol (CAS No.: 1515-14-6), 2,2,3,3-tetrafluoropropyl difluoromethyl ether (CAS No.: 35042-99-0), 1,1,1,2,3,3-hexafluoro-2-methoxypropane (CAS No.: 568550-25-4), hexafluoroisopropyl methyl ether (CAS No.: 27215-56-1), 1-(2,2-Difluoroethoxy)-1,1,2,2-tetrafluoroethane, CAS: 50807-77-7), 2,2,3,3,4,4-Hexafluoro-1-butanol (CAS No.: 60838-59-7), 1,1,2,2,3,3-hexafluoro-1-methoxypropane (CAS No.: 160620-20-2), 1-Propanol, 2-(difluoromethyl)-2,3,3,3-tetrafluoro (CAS No.: 318293-89-9), 1,1,1,4,4,4-hexafluoro-2-butanol (CAS No.: 86884-17-5), 1-hydro-1-methoxyhexafluoropropane (CAS No.: 123202-00-6), 1,1,2,2,3,3-hexafluorobutan-1-ol (CAS No.: 119398-75-3), and 3,3,3-trifluoro-2-(trifluoromethyl)propan-1-01 (CAS No.: 81503-71-1).

Examples of $C_4H_2F_6O_2$ isomers include 3,3,3-Trifluoro-2-(trifluoromethyl)propanoic acid (CAS No.: 564-10-3), 2,2,2-Trifluoroethyl trifluoroacetate (CAS No.: 407-38-5), 2,2,3,3,4,4-hexafluorobutanoic acid (CAS No.: 679-12-9), 2,2,3,4,4,4-Hexafluorobutanoic acid (CAS No.: 379-90-8), 1,1,1,3,3,3-Hexafluoro-2-propanyl formate (CAS No.: 856766-70-6), Trifluoromethyl 3,3,3-trifluoropropanoate (CAS No.: 93667-89-1), (2E)-1,1,1,4,4,4-Hexafluoro-2-butene-2,3-diol (CAS No.: 856295-72-2), and 1,1,1,4,4,4-Hexafluoro-3-hydroxy-2-butanone (CAS No.: 1683-73-4).

The disclosed oxygen-containing hydrofluorocarbon gases are provided at greater than 95% v/v purity, preferably at greater than 99.99% v/v purity, and more preferably at greater than 99.999% v/v purity. The disclosed oxygen-containing hydrofluorocarbon gases contain less than 5% by volume trace gas impurities, with less than 150 ppm by volume of impurity gases, such as $N_2$ and/or $H_2O$ and/or $CO_2$, contained in said trace gaseous impurities. Preferably, the water content in the plasma etching gas is less than 20 ppm by weight. The purified product may be produced by distillation and/or passing the gas or liquid through a suitable adsorbent, such as a 4 Å molecular sieve.

The disclosed oxygen-containing hydrofluorocarbon gases may contain between 0.01% v/v and 99.99% v/v of its isomers, particularly when the isomer mixture provides improved process parameters or if isolation of the target isomer is too difficult or expensive. The mixture of isomers may also reduce the need for two or more gas lines to the reaction chamber. In case, some of the disclosed oxygen-containing hydrofluorocarbon compounds are non-gaseous compounds at room temperature and atmospheric pressure (i.e., liquid or solid), their gas form may be produced by vaporizing the compounds through a conventional vaporization step, such as direct vaporization or by bubbling with inert gas (such as $N_2$, Ar, He). The non-gaseous compounds may be fed in liquid state to a vaporizer where it is vaporized before it is introduced into a reactor.

The disclosed oxygen-containing hydrofluorocarbon molecule with at least one ether group or at least one carbonyl group could bring improved uniformity of etched hole's shape by taking advantage of better control of polymer film deposition profile compared to the case when $O_2$ is used (e.g., increased anisotropy and/or bowing) in the plasma-etching process. Additionally, use of molecule from the disclosed oxygen-containing hydrofluorocarbon molecule allows the etching of Si-containing compounds with higher etch rates while having a lower amorphous carbon etch rate compared to standard fluorocarbon gases (e.g., $C_4F_6$, $CH_2F_2$, $C_4F_6$), resulting in improved selectivity to the mask layer during the etching of high aspect ratio structures. The disclosed oxygen-containing hydrofluorocarbon molecule with at least one ether group or at least one carbonyl group may be beneficial for improvement of high aspect ratio etching process linked to the generation of oxygen-containing hydrofluorocarbon and/or oxygen-containing fluorocarbon fragments by dissociation of the disclosed oxygen-containing hydrofluorocarbon molecule with at least one ether group in the plasma. Commonly $O_2$ is used in the plasma gas mixture for both control the Si-containing film etch rate and etching profiles by adjusting thickness of the deposited fluorinated polymer film. In contrast, $O_2$ is also efficient for etching of the amorphous carbon mask layer, leading to reduced selectivity. Furthermore, addition of $O_2$ promotes isotropic etching and results in removal of fluorinated polymer protection film and amorphous carbon mask, reducing sidewall protection and formation of undesired distortions in pattern's profile (e.g., increase in diameter, bowing). That is, amorphous carbon mask and deposited polymer films are etched faster and more isotropically using $O_2$. The disclosed oxygen-containing hydrofluorocarbon molecules are capable of providing more anisotropic etching process resulting in better profile control and lower amorphous carbon and fluoropolymer film etch rates. The difference between the disclosed oxygen-containing hydrofluorocarbons and fluorocarbons with addition of molecular oxygen is generated reactive species in plasma. Oxygen-containing fluorocarbon and hydrofluorocarbon fragments produced in the plasma by dissociation of the disclosed oxygen-containing hydrofluorocarbon molecules are less reactive with carbon-based materials compared to oxygen radicals formed from molecular oxygen, therefore, in the case of oxygen-containing hydrofluorocarbon gases, additional ion bombardment is required to react and remove amorphous carbon and fluorinated polymer films, bringing higher anisotropy. Furthermore, it has been verified from Examples that follow that the fluorocarbon-based fragments from the oxygen-containing fluorocarbon and hydrofluorocarbon molecules may preferentially deposit on pattern sidewalls bringing additional protection, while both fluorocarbon and oxygen-containing fluorocarbon fragments allows a high etch rate of Si-containing materials.

The disclosed oxygen-containing hydrofluorocarbon gases are capable of improving etch rate, etched structure profile control and selectivity by producing oxygen-containing fluorocarbon or hydrofluorocarbons reactive species together with fluorocarbon and hydrofluorocarbon fragments when molecular $O_2$ flow rate in the etching gas mixture is reduced or eliminated.

The disclosed oxygen-containing hydrofluorocarbon molecules also bring higher etch rates than molecules having the same composition but without oxygen. Additionally, achieving higher etch rate and improved control of the etching profile, the disclosed oxygen-containing hydrofluorocarbon molecules are typically having lower global warming potential compared to standard gases.

The higher etch rate may be achieved as follows. First, effective oxygen-containing fluorocarbon and/or hydrofluorocarbon fragments may reach the bottom of high aspect ratio structures more easily due to their potentially low sticking coefficients. Secondly, thanks to the oxygen in the fragments, fluorine and oxygen atoms are delivered to the etched surface simultaneously so that it is easier to control the reactivity and the thickness of the polymer and mixed layer at the bottom of high aspect ratio structures. Thus, the disclosed oxygen-containing hydrofluorocarbon molecules are effective for anisotropic etching and there may be two mechanisms responsible for that. First, generation of F- and O-rich thin polymer on the bottom of the high aspect ratio structures, by providing high density of F- and O-containing radicals and ions from plasma (F- and O-containing radicals and ions are reactive and providing isotropic etching). Next, hydrofluorocarbon and fluorocarbon fragments without oxygen are also generated in the disclosed etching process and able to deposit a protection polymer film on sidewalls and protect amorphous carbon mask together with the sidewalls. The protection polymer film is formed mainly by carbon-containing fragments without oxygen as explained above.

Figure 2:
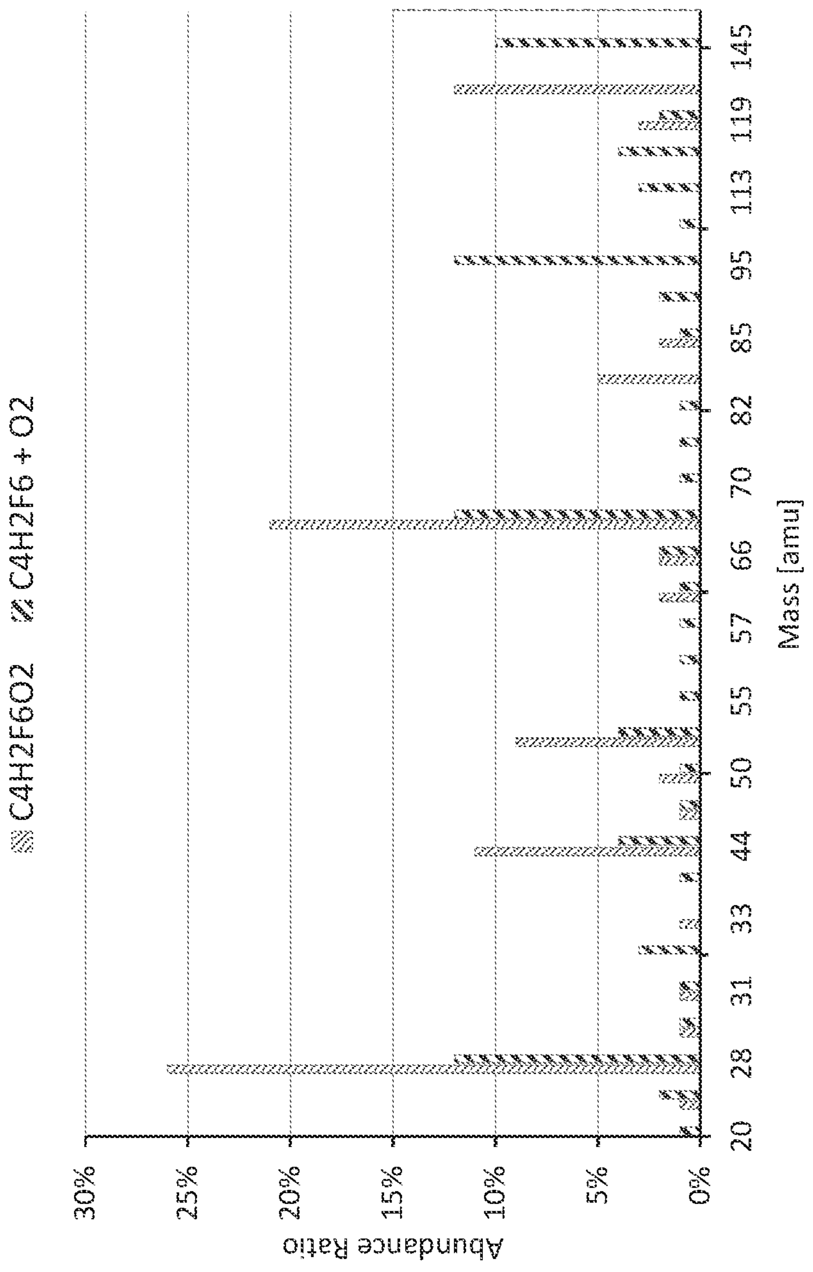
FIG. 2 summarizes fragments and molecules present in plasma afterglow recorded by quadrupole mass spectrometry (QMS)

FIG. 2 summarizes fragments and molecules present in plasma afterglow recorded by quadrupole mass spectrometry (QMS) using electron energy of 25 eV, when $C_4H_2F_6O_2$ or mixture of $C_4H_2F_6+O_2$ was supplied to the etching chamber at flows resulting in equal supply of C, H, F and O atoms. It may be observed from the QMS spectrum that in case of oxygen-containing hydrofluorocarbon ($C_4H_2F_6O_2$), CO and $CO_2$ fragments were observed in higher amount comparing to $C_4H_2F_6+O_2$ gas mixture. Moreover, $C_3H_2F_3O_2$ oxygen-containing fragment was formed from $C_4H_2F_6O_2$ by direct dissociation of $C_4H_2F_6O_2$, whereas this oxygen-containing fragment $C_3H_2F_3O_2$ was not formed from $C_4H_2F_6+O_2$ gas mixture (mostly hydrofluorocarbon fragments were observed in the case of $C_4H_2F_6+O_2$). This confirms that incorporation of oxygen atom into hydrofluorocarbon molecules (i.e., oxygen-containing hydrofluorocarbon) allows producing oxygen-containing reactive species by direct dissociation of the oxygen-containing hydrofluorocarbon molecule, allowing simultaneous delivery of 0 and F atoms to etched surface and increasing etch rate.

On the other hand, in case of $C_4H_2F_6+O_2$ gas mixture, strong signal from $C_4H_2F_6$ parent molecule was recorded, indicating low rate of dissociation. In contrast, no signal of oxygen-containing hydrofluorocarbon, $C_4H_2F_6O_2$, is recorded in the case of $C_4H_2F_6O_2$, indicating that it is easier to dissociate $C_4H_2F_6O_2$ molecule by electron impact to ionize it. High rate of dissociation of $C_4H_2F_6O_2$ molecule may be explained by weak bound in ether group resulting in easy break of those bounds by electron impact and dissociation of molecule. Therefore, it is preferable to use oxygen-containing hydrofluorocarbons with at least one oxygen atom incorporated into ether group or carbonyl group to promote dissociation of molecule in plasma, thereby, enhancing generation of reactive species and increasing etch rate.

In addition, in case of $C_4H_2F_6O_2$, more $CF_3$ fragments were produced comparing to $C_4H_2F_6+O_2$ gas mixture under identical conditions shown in FIG. 2. It indicates that easy dissociation of $C_4H_2F_6O_2$ molecule due to the presence of ether group is beneficial for generation of fluorocarbon fragments as well. $CF_3$ is one of fluorocarbon fragments responsible for etching. A higher concentration of $CF_3$ fragments is beneficial for increase of etch rate.

<Other Process Gasses>

Another gas such as inert gas and/or oxidizing gas may be added to the process gas mixture. The inert gas may be one or more gases selected from $N_2$, He, Ar, Kr, Xe, Ne. Use of a noble gas increases ion bombardments during the etching process depending on gas ratio in the process gas mixture. The use of the noble gas promotes or suppresses dissociation of other gases in the process gas mixture, which causes direct impact on etching speed and anisotropy of the etching process. Furthermore, addition of oxidizing gas (such as $O_2$, $O_3$, CO, $CO_2$, COS, SO, $SO_2$, FNO, NO, $NO_2$, $H_2O$) allows increasing the etching speed, depending on the process gas mixture and type of target and non-target materials isotropy and selectivity of the etching process.

Further additional gas from the list of $H_2$, $SF_6$, $NF_3$, $N_2$, $NH_3$, $Cl_2$, $F_2$, $Br_2$, $BCl_3$, HBr, HCl, HBr, $PF_3$, $CF_3I$, $C_3F_7I$, $C_4F_9I$, $C_4H_9F_3Si$, $C_5H_9F_5Si$ may be added to the etching gas mixture in order to improve control of the process or increase etch rate.

<Flow of Plasma-Etching Method>

Most of semiconductor devices are formed using processes of formation of thin films on the top of a substrate and patterning of those thin films to receive desired structures and devices. Patterning includes lithography step, which allows defining a formed pattern and etching steps that are used to remove unnecessary materials or films from the substrate through the formed pattern. One of commonly used etching processes is a plasma dry etching when the substrate is exposed to plasma or reactive species formed in the inside of a process chamber. Combination of physical (e.g., sputtering by ion bombardment) and chemical (e.g., surface interactions with reactive species) mechanisms in plasma etching allows achieving preferential etching of a particular material selectively to other materials depending on used chemistry and process conditions, in which volatile by-products is formed and will be removed.

Detailed explanation of flow of the disclosed plasma etching method is as follows. In the first step, a workpiece containing one or more target etching films and optionally containing non-target plasma etching film that may be patterned (having some pattern such as openings in the film) is brought to a plasma-etching chamber. The workpiece may be any types of targets as long as it could be processed by plasma etching. For example, monocrystalline Si wafer including at least one Si-containing film, organic film or metal containing film or plural films part of which may be patterned.

Example of workpiece having target etching film and non-target etching film with pattern is shown on FIG. 1A.

The plasma etching chamber consists of vessel capable of providing low pressure inside the vessel by degassing, plasma generator capable of generating plasma inside the chamber and a workpiece holder capable of holding or mounting the workpiece inside the chamber exposed to the plasma with regulation of the temperature using apparatus or gas flow (e.g., helium flow). Then a process gas mixture, including several gases in specified proportions that may change during the etching process, is introduced into the plasma-etching chamber and pressure inside the chamber is maintained at defined value or several values that may be changed during the etching process. Next, the plasma generator applies high frequency electromagnetic field to the process gas mixture resulting in formation of the glow discharge. When the workpiece is exposed to the plasma generated inside the plasma-etching chamber, the targeted film is being removed by combination of ion bombardment and interaction with reactive species versus the non-target film resulting in the formation of apertures with high aspect ratio and volatile by-products.

The disclosed plasma etch methods for forming a structure or aperture by selectively etching one or more silicon-containing films in a substrate using a patterned mask layer deposited on the top of the one or more silicon-containing films comprises the steps of:

- mounting the substrate in a processing chamber;
- introducing an etching gas containing a vapor of an oxygen-containing hydrofluorocarbon into the processing chamber;
- converting the etching gas to a plasma; and
- allowing an etching reaction to proceed between the plasma and the one or more silicon-containing films so that the one or more silicon-containing films are selectively etched versus the patterned mask layer to form the structure or aperture. The formed structure or aperture are high aspect ratio structure or aperture. An aspect ratio of the high aspect ratio structure or aperture may be up to 1:400.

The one or more processing films may be silicon-containing films including $Si_aO_bC_cN_dH_e$ where a, b, c, d, e range from 0.1 to 6 and b, c, d, e each may be independently 0. The one or more processing films may also include dopants, such as B, C, P, As Ga, In, Sn, Sb, Bi and/or Ge. The non-etching films may be patterned hardmask layers, e.g., amorphous carbon, amorphous silicon, doped amorphous carbon, doped amorphous silicon, metals, etc.

In the disclosed plasma etching method, the plasma etching chamber is equipped with parallel plate electrodes plasma generators where a high frequency electromagnetic field of 60 MHz is applied to the upper electrode and a 2 MHz one is applied to the lower electrode, when the gap between the electrodes is kept in a range between 10 and 35 mm. Combination of these electric fields allows applying power to the upper electrode within a range of 0-2000 W and to the lower electrode within the range of 1500-7000 W. Pressure in the etching chamber during the plasma-etching process is maintained between 15 and 30 mTorr with introduced the process gas mixture.

If necessary, a container containing the disclosed oxygen-containing hydrofluorocarbon etching compounds may be heated to a temperature that permits the oxygen-containing hydrofluorocarbon etching compounds to be gas phase or in liquid phase having a sufficient vapor pressure for delivery into a plasma-etching chamber or a reaction chamber. The container may be maintained at temperatures in the range of, for example, approximately 0° C. to approximately 150° C., preferably from approximately room temperature to approximately 100° C., more preferably from approximately room temperature to approximately 50° C. More preferably, the container is maintained at room temperature in order to avoid heating lines to the plasma-etching chamber. Those skilled in the art recognize that the temperature of the container may be adjusted in a known manner to control the amount of the oxygen-containing hydrofluorocarbon etching compounds vaporized.

Temperature and pressure within the plasma-etching chamber are held at conditions suitable for the processing films to react with the activated etching gas. For instance, the pressure in the chamber may be held between approximately 0.1 mTorr and approximately 1000 Torr, preferably between approximately 1 mTorr and approximately 10 Torr, more preferably between approximately 10 mTorr and approximately 1 Torr, even more preferably between approximately 10 mTorr and approximately 100 mTorr, as required by etching parameters. Likewise, substrate temperature in the plasma-etching chamber may range from approximately −196° C. to approximately 500° C., preferably from approximately −120° C. to approximately 300° C., more preferably from approximately −100° C. to approximately 50° C.; and more preferably from approximately −70° C. to approximately 40° C. Chamber wall temperature may range from approximately −196° C. to approximately 300° C. depending on process requirements.

Typical materials that need to be etched may be SiO or SiN. An etch stop layer may be silicon oxygen nitride (SiON), poly silicon, metal or metal nitride (e.g., W or TiN). A mask material used may be a-C, doped a-C, amorphous silicon (a-Si), doped a-Si or p-Si, selected from B-doped a-C, W-doped a-C, B-doped a-Si, or photo resist materials.

The disclosed plasma etch methods using the disclosed oxygen-containing hydrofluorocarbon compounds as etching gas produce apertures, such as channel holes, gate trenches, staircase contacts, capacitor holes, contact holes, contact etch, slit etch, self-aligned contact, self-aligned vias, super vias etc., in silicon-containing films. The resulting apertures may have an aspect ratio ranging from approximately 5:1 to approximately 500:1, preferably from approximately 20:1 to approximately 400:1; and a diameter ranging from approximately 5 nm to approximately 500 nm, preferably less than 100 nm. The resulting apertures may have an aspect ratio above 5, preferably above 10, more preferably above 20. For example, one of ordinary skill in the art will recognize that a channel hole etch produces apertures in the silicon-containing films having an aspect ratio greater than 50. The silicon-containing film comprises a layer of $Si_aO_bH_cC_dN_e$, where a>0, b, c, d and e≥0, selected from silicon oxide, silicon nitride, crystalline Si, poly-silicon, polycrystalline silicon, amorphous silicon, low-k SiCOH, SiOCN, SiC, SiON, or a stack of alternating silicon oxide and silicon nitride (ONON) films or alternating silicon oxide and poly-silicon (OPOP) films.

However, the disclosed plasma etching method is not limited to the above stated experimental conditions in any way, types of plasma etching tool (e.g., capacity coupled or inductively coupled plasma), process conditions (e.g., pressure, power, temperature, duration of process), process gas mixture, combination and proportion of gases in the process gas mixture, gas flow, workpiece and plasma etching chamber itself may be altered for each process and during the process.

In summary, the disclosed plasma etching methods provide new chemistries able to enhance control of the deposition profile of the polymer film, as well as to etch silicon oxide and silicon nitride or combination thereof with high etch rates and selectivity. Additionally, the disclosed oxygen-containing hydrofluorocarbon compounds have lower global warming potentials compared to commonly used ones (e.g., $SF_6$, $C_4F_6$ and $C_4F_6$), enabling more eco-friendly processes.

Furthermore, the disclosed plasma etching methods provide use of an oxygen-containing hydrofluorocarbon compound or gas as an etching gas, preferably an oxygen-containing hydrofluorocarbon compound or gas with oxygen included into an ether group. The disclosed oxygen-containing hydrofluorocarbon compounds are effective for control of polymer film deposition to keep defined etching profile, while also etching Si-containing materials (e.g., $SiO_2$, $Si_3N_4$, or a stack of alternating $SiO_2$ and $Si_3N_4$ layers) with high etch rates and high selectivity to a mask layer (e.g., amorphous carbon, amorphous silicon). The disclosed plasma etching method may apply to etching of high aspect ratio structures, such as, contact holes, channels, high aspect ratio capacitors, required for fabrication of semiconductor devices such as 3D NAND and DRAM.

There are advantages of adding oxygen-containing hydrofluorocarbon to an etching gas mixture. When a vapor of the disclosed oxygen-containing hydrofluorocarbon is added to an etching gas mixture, observed improvements in performance is attributed to generation of specific reactive species in plasma by dissociation, compared to commonly used fluorocarbons and hydrofluorocarbons, e.g., $C_4F_6$, $C_4F_6$, $CH_2F_2$, and use less to no molecular $O_2$ in the gas mixture. Formation of oxygen-containing reactive fluorocarbon and hydrofluorocarbon species by direct dissociation of the disclosed oxygen-containing hydrofluorocarbon in the plasma allows delivering reactive oxygen and fluorine to the surface of target etching material simultaneously, resulting in the formation of volatile by-products, such as, fluorides and/or oxyfluorides of etching target material. This increases etch rate compared to commonly used mixture of fluorocarbon or hydrofluorocarbons with molecular $O_2$ where delivery of reactive oxygen and fluorine to surface of target etching materials happens independently, which may result in an etch rate reduction. On the other hand, the presence of oxygen in the disclosed oxygen-containing hydrofluorocarbon allows reducing or even excluding use of molecular $O_2$ in the etching gas mixture, which results in reduced isotropy of the etching process and lower damage of sidewalls (lateral etch) of the etched structure and mask. Moreover, the generation of fluorocarbon and hydrofluorocarbon fragments by dissociation of the disclosed oxygen-containing hydrofluorocarbons with potentially lower sticking coefficient compared to counterparts in the plasma allows depositing more conformal polymer on the sidewall of the etched structure and mask, thereby further improving control of the etched structure profile and selectivity to the mask. Here the etched structure may be an aperture, via, hole, or trench. Use of molecular $O_2$ gas leads to the generation of oxygen reactive species (e.g., atoms, radicals and ions) that promotes isotropic etching leading to damage of the amorphous carbon mask layer and sidewall protective polymer film. In contrast, use of vapor of the disclosed oxygen-containing hydrofluorocarbons (preferentially containing an ether group) as an etching gas provides a better control over the polymer film deposition on sidewall and mask, resulting in preferentially anisotropic etching of the targeted material and an improved control of shape of the etched structure. This helps keep the protective film on the sidewalls during etching process and etch high aspect ratio structures with a thin and straight profile by preventing lateral etching and profile distortions. In addition, the vapor of the disclosed oxygen-containing hydrofluorocarbons is also effective for anisotropic etching $SiO_2$ and $Si_3N_4$ with a high etch rate compared to commonly used etching chemistry (e.g., $C_4F_6$, $C_4F_6$, $O_2$) and also effective for a selectivity of $SiO_2$ versus SiN. The selectivity of $SiO_2$ versus SiN using the disclosed oxygen-containing hydrofluorocarbons may range from approximately 1:20 to 20:1; preferably from 1:10 to 10:1, more preferably from 1:5 to 5:1, even more preferably from 1:2 to 2:1. The selectivity of $SiO_2$ versus SiN using the disclosed oxygen-containing hydrofluorocarbons may be close to approximately 1. Decreased sticking coefficient of hydrofluorocarbons disclosed in US 20210193475 to Ishino et al. is also beneficial for improvement of polymer uniformity during etching process resulting better profile control of the etched structure. The disclosed oxygen-containing hydrofluorocarbons may provide higher selectivity by depositing more conformal hydrofluorocarbon polymer to protect the mask layer (e.g., a-C mask) and sidewall and reduced use of molecular $O_2$ in the etching gas mixture, resulting in reduced isotropy of the etching process.

According to the present disclosure, it is possible to provide a plasma etching method that may increase the selectivity to the mask and sufficiently inhibit the lateral dimension expansion of the etched structure during a high aspect ratio etching process while keeping high etch rate by use of a vapor of oxygen-containing hydrofluorocarbon compound.

EXAMPLES

A more detailed description of the disclosed methods through examples is provided as follows. However, the disclosed methods is not limited to presented examples in any way and process conditions, process gas mixture, combination and proportion of gases in the gas mixture, workpiece and plasma etching chamber itself may be altered.

Plasma etching conditions, plasma etching chamber and workpiece together with results of plasma etching process are described in the examples below.

<Plasma Etching Device>

In the disclosed methods, a parallel plate (capacity coupled plasma) plasma generator was used as the plasma etching device. The parallel plate configuration included upper electrode and lower electrode, on which the workpiece was placed (lower electrode was used as sample holder with temperature regulation capability). The separation between the electrodes was 20 mm. The upper electrode was connected to 60 MHz generator while the lower electrode was connected to 2 MHz generator.

<Plasma Etching Condition>

During the plasma etching process power supplied to the upper electrode was varied in range from 500 to 2000 W, while power applied to the lower electrode was varied in range from 750 to 7000 W. Pressure has been maintained constant during the process at values selected in range between 15 and 30 mTorr. The plasma etching time was set at value between 30 and 300 seconds. Etch rate has been estimated in nanometers per minute. Plasma process gas mixture included at least one of gases from the list: Ar, $O_2$, $C_4H_2Fe$ as a hydrofluorocarbon gas and $C_4H_2F_6O_2$ or $C_4H_4F_6O$ as oxygen-containing hydrofluorocarbon gas.

<Workpieces>

In Examples 1-5 and 11-17, a workpiece shown in FIG. 1A was used. Target etching film 2 was a $SiO_2$ film with a thickness of 3000 nm (numeral 3). Non-target etching material 4 was a patterned film of amorphous carbon with a thickness of 868 nm (numeral 5). Bottom diameter of opening pattern in amorphous carbon film 4 (numeral 6) was about 120 nm. Example of the workpiece profile after being conducted the etching process shown in FIG. 1B.

In Examples 6-10, a workpiece of monocrystalline silicon plane wafer with target etching $SiO_2$ film having a thickness of 2000 nm deposited on top of the monocrystalline silicon plane wafer was used for silicon oxide etching; a workpiece of monocrystalline silicon plane wafer with target etching $Si_3N_4$ film having a thickness of 2000 nm deposited on top of the monocrystalline silicon plane wafer was used for silicon nitride etching.

<Plasma Etching Profile and Selectivity>

For comparison of high aspect ratio etching performances of the disclosed plasma etching processes and the reference plasma etching processes using molecules with the same amount of C, H, and F atoms excluding O, referring to FIG. 1A and FIG. 1B, selectivity, top CD, neck CD and bow CD were chosen, which may present control of etched pattern profiles. Selectivity has been calculated as the ratio of silicon dioxide etching depth (numeral 8 in FIG. 1B) to the difference between thickness of initial amorphous carbon mask (numeral 5 in FIG. 1A, i.e., 868 nm) to mask thickness of mask after the etching process (numeral 7 in FIG. 1B). In the event when negative value of selectivity has been obtained (i.e., when thickness of amorphous carbon mask has been increased after the etching process), this condition has been referred as condition with "infinite selectivity", meaning that thickness of mask was increasing because of the etching process.

During comparison, higher value of selectivity was targeted, when top CD (numeral 9 in FIG. 1B) and neck CD (numeral 12 in FIG. 1B) were targeted to be as close as possible to the value of the diameter of bottom of opening in the amorphous carbon mask (i.e., 120 nm, numeral 6 on FIG. 1A).

Example 1

Plasma etching was performed in a plasma etching chamber where power of 1400 W was applied to the top electrode at frequency of 60 MHz, power of 7000 W was applied to the bottom electrode at a frequency of the 2 MHz, power applied to both top and bottom electrode was pulsed at 500 Hz with duty cycle of 60%. Pressure in the chamber was maintained at 25 mTorr and gap between the electrodes was set at 20 mm. A process gas mixture including following flows of gases was introduced to the plasma-etching chamber: 150 sccm of Ar and 65 sccm of $C_4H_2F_6O_2$. Plasma etching process was carried out for 1 minute. Resulting the structure of cross-section of the workpiece after the etching process observed by SEM (not shown), comparison results are summarized in Table 1.

Example 2

Plasma etching was performed in the same way as in Example 1, with exception that process gas mixture was replaced by the following: 150 sccm of Ar, 65 sccm of $O_2$ and 65 sccm of $C_4H_2F_6$. Resulting the structure of cross-section of the workpiece after the etching process observed by SEM (not shown), comparison results are summarized in Table 1.

Example 3

Plasma etching was performed in the same way as in Example 1, with exception that process gas mixture was replaced by the following: 150 sccm of Ar, 19.5 sccm of $O_2$ and 65 sccm of $C_4H_2F_6O_2$. Resulting the structure of cross-section of the workpiece after the etching process observed by SEM (not shown), comparison results are summarized in Table 1.

Example 4

Plasma etching was performed in the same way as in Example 1, with exception that process gas mixture was replaced by the following: 150 sccm of Ar, 84.5 sccm of $O_2$ and 65 sccm of $C_4H_2F_6$. Resulting structure of cross-section of workpiece after the etching process observed by SEM (not shown), comparison results are summarized in Table 1.

TABLE 1

Summary of compared values for Examples 1-4

| Example | Main etching gas | $SiO_2$ ER (nm/min) | a-C ER (nm/min) | Selectivity ($SiO_2$/a-C) | Neck CD (nm) | TOP CD (nm) |
|---|---|---|---|---|---|---|
| 1 | $C_4H_2F_6O_2$ | 336 | −152 | ∞ | 100 | 49 |
| 2 | $C_4H_2F_6 + O_2$ | 510 | −112 | 00 | 127 | 126 |
| 3 | $C_4H_2F_6O_2 + O_2$ | 601 | −100 | 00 | 115 | 121 |
| 4 | $C_4H_2F_6 + O_2$ | 528 | −47 | 00 | 163 | 155 |

Example 5

Plasma etching was performed in a plasma etching chamber where power of 1400 W was applied to the top electrode at frequency of 60 MHz, power of 7000 W was applied to the bottom electrode at a frequency of the 2 MHz, power applied to both top and bottom electrode was pulsed at 500 Hz with duty cycle of 60%. Pressure in the chamber was maintained at 25 mTorr and gap between the electrodes was set at 20 mm. One of the following gas mixtures with defined gas flows was introduced to the plasma-etching chamber: 150 sccm of Ar and, 13 sccm of $O_2$, 65 sccm of $C_4H_2F_6O_2$ or 150 sccm of Ar and, 78 sccm of $O_2$, 65 sccm of $C_4H_2F_6$. Plasma etching process was carried out for 1, 3.5 or 6.5 minutes. Resulting etch rates as a function of aspect ratio of the etched structure is summarized in FIG. 3.

The results observed in Table 1 indicates that the deposited polymer film on a-C mask and sidewall of the etched structure was etched anisotropically by oxygen-containing hydrofluorocarbon reactive species generated from $C_4H_2F_6O_2$ and directional ion bombardment (in vertical direction), leading to absence of lateral etching and development of the polymer film on the sidewall of mask and etched structure in Example 1. On contrary, in the case of $C_4H_2F_6$ and $O_2$ gas mixture in Example 2 more isotropic etching process was observed due to generation of reactive oxygen species from $O_2$, resulting in the presence of lateral etch, CD expansion and less to no polymer deposition on sidewalls. Since the process conditions in both Examples 1 and 2 were chosen to achieve the same number of C, H, F, O and Ar atoms in the gas mixture and all other parameters were the same when only the way of supplying oxygen was different (in $C_4H_2F_6O_2$ or in $O_2$), it clearly shows the difference between bringing oxygen in the hydrofluorocarbon molecule and in the $O_2$ molecule. This means that the observed difference in results was originated only from the way of supplying the oxygen from either $C_4H_2F_6O_2$ or $O_2$. It may be concluded that supplying oxygen by using oxygen-containing hydrofluorocarbon as an etching gas brings improved selectivity and etched structure profile control by improved polymer deposition and higher anisotropy compared to use of molecular $O_2$.

The initial workpiece with patterned mask, $SiO_2$ hole etched using conditions from Example 1 with $C_4H_2F_6O_2$/Ar etching gas mixture and $SiO_2$ hole etched using conditions from Example 2 with $C_4H_2F_6/O_2$/Ar gas mixture measured by SEM (not shown), comparison results are summarized in Table 1.

As it may be observed in Table 1, addition of small amount of $O_2$ to Ar/$C_4H_2F_6O_2$ etching gas mixture in Example 3 results in significant increase of etch rate compared to the case without $O_2$ in Example 1. Moreover, it may be observed that in case of Experiment 4 when oxygen was supplied only in $O_2$ molecule, etching speed is lower and lateral etching is much faster compared to results from Experiment 3 where oxygen was mainly supplied from $C_4H_2F_6O_2$. Faster etch rate, reduced lateral etch and improved control of the etched structure profile demonstrated in Example 3 clearly shows that use of oxygen-containing hydrofluorocarbon is essential for etching of high aspect ratio structures. Considering that number of C, F, H and O atoms in the gas mixtures in Examples 3 and 4 was the same, it may be concluded that incorporation of oxygen into hydrofluorocarbon molecule in the case of $C_4H_2F_6O_2$ is beneficial for increase of etch rate and increase of anisotropy compared to use of $C_4H_2F_6/O_2$ gas mixture. Suggested mechanism is that oxygen-containing fluorocarbon and hydrofluorocarbon fragments generated by dissociation of $C_4H_2F_6O_2$ may have lower sticky coefficient compared to fragments generated from commonly used fluorocarbon or hydrofluorocarbon gases therefore, the oxygen-containing fluorocarbon and hydrofluorocarbon fragments could easily reach the bottom of the etched structure and deliver F and O simultaneously to produce a F- and O-rich thin polymer film on the bottom promoting formation of volatile byproducts and increasing etching speed.

Results summarized in the Table 1 confirms the above statements. It may be noted that when $O_2$ is not added to the $C_4H_2F_6O_2$ in Example 1, the process features rich deposition resulting in development of polymer film, shrinking of both top and neck CD and reduced etch rate when compared to $C_4H_2F_6/O_2$ gas mixture in Example 2. However, in Example 3 when small amount of $O_2$ was added to $C_4H_2F_6O_2$ top and neck CD were almost identical to initial values, when it was significantly expanded due to lateral etch in Example 4 where $C_4H_2F_6/O_2$ mixture was used to match C, H, F and O atoms number to Example 3. Moreover, in Example 3 infinite selectivity to the mask with higher etch rate compared to Example 4 was achieved in addition to good preservation of top and neck CD. Observed results demonstrate that it is possible to improve all of comparison results (etch rate, top CD and neck CD) while maintaining infinite or high value of selectivity if oxygen is introduced into an etching gas mixture using a vapor of oxygen-containing hydrofluorocarbon instead of molecular $O_2$ or introduced using combination of molecular $O_2$ and a vapor of oxygen-containing hydrofluorocarbon. Capability of keeping top and neck CDs close to initial value after etching in Example 3 demonstrates exceptional control of shape of etched structure when oxygen-containing hydrofluorocarbon is added to etching gas mixture or used as a main etchant.

Figure 3:
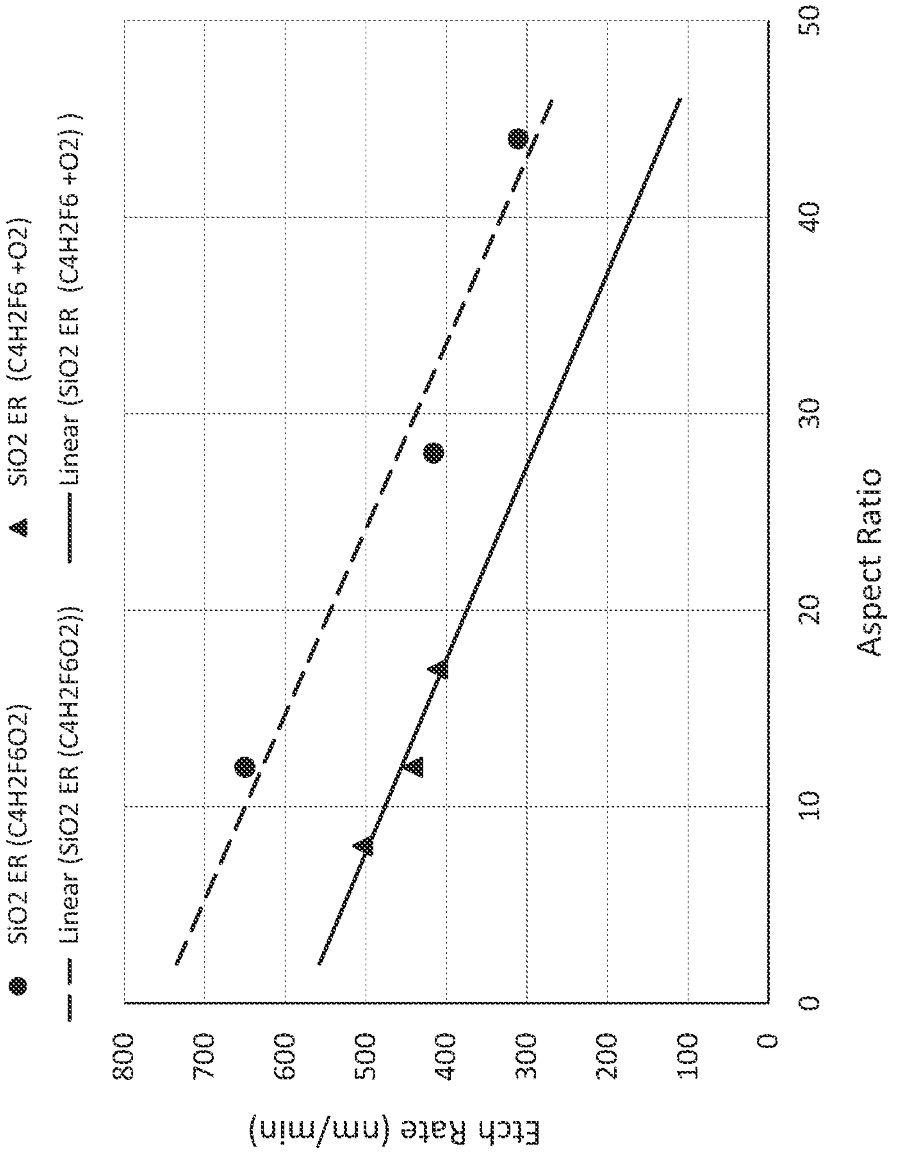
FIG. 3 is resulting etch rates as a function of aspect ratio of the etched structures.

Results in FIG. 3 indicate that use of oxygen-containing hydrofluorocarbon gas provides a higher etch rate compared to use of hydrofluorocarbon and molecular oxygen gas mixture also at higher aspect ratio of etched structure. Observed higher etch rate was explained in discussion of Table 1 and it is supposed to remain the same with increase of aspect ratio. Suggested mechanism may be reduced sticking coefficient of oxygen-containing hydrofluorocarbon and fluorocarbon fragments which allows them to reach the bottom of high aspect ratio structure more easily and simultaneously provide F and O to the etched surface.

Example 6

Plasma etching was performed in a plasma etching chamber where power of 1400 W was applied to the top electrode at frequency of 60 MHz, power of 7000 W was applied to the bottom electrode at a frequency of the 2 MHz, power applied to both top and bottom electrode was pulsed at 500 Hz with duty cycle of 60%. Pressure in the chamber was maintained at 25 mTorr and gap between the electrodes was set at 20 mm. Following a gas mixture with defined gas flows was introduced to the plasma-etching chamber: 150 sccm of Ar, 65 sccm of $C_4H_2F_6O_2$ and a flow of $O_2$ varied ranging between 0 and 40 sccm. Plasma etching process was carried out for 2 minutes. Resulting etch rates of $SiO_2$ and $Si_3N_4$ and selectivity of $SiO_2/Si_3N_4$ as a function of $O_2$ flow are presented in FIG. 4A.

Example 7

Plasma etching was performed in a plasma etching chamber where power of 1400 W was applied to the top electrode at frequency of 60 MHz, power of 7000 W was applied to the bottom electrode at a frequency of the 2 MHz, power applied to both top and bottom electrode was pulsed at 500 Hz with duty cycle of 60%. Pressure in the chamber was maintained at 25 mTorr and gap between the electrodes was set at 20 mm. Following a gas mixture with defined gas flows was introduced to the plasma etching chamber: 150 sccm of Ar, 65 sccm of $C_4H_2F_6$ and flow of $O_2$ varied ranging between 0 and 40 sccm. Plasma etching process was carried out for 2 minutes. Resulting etch rates of $SiO_2$ and $Si_3N_4$ and selectivity of $SiO_2/Si_3N_4$ as a function of $O_2$ flow are presented in FIG. 4B.

Example 8

Plasma etching was performed in a plasma etching chamber where power of 1400 W was applied to the top electrode at frequency of 60 MHz, power of 7000 W was applied to the bottom electrode at a frequency of the 2 MHz, power applied to both top and bottom electrode was pulsed at 500 Hz with duty cycle of 60%. Pressure in the chamber was maintained at 25 mTorr and gap between the electrodes was set at 20 mm. Following a gas mixture with defined gas flows was introduced to the plasma-etching chamber: 150 sccm of Ar, 65 sccm of $C_4F_8$ and flow of $O_2$ varied ranging between 0 and 40 sccm. Plasma etching process was carried out for 2 minutes. Resulting etch rate of $SiO_2$ and $Si_3N_4$ and selectivity of $SiO_2/Si_3N_4$ as a function of $O_2$ flow are presented in FIG. 4C.

Example 9

Figure 4A:
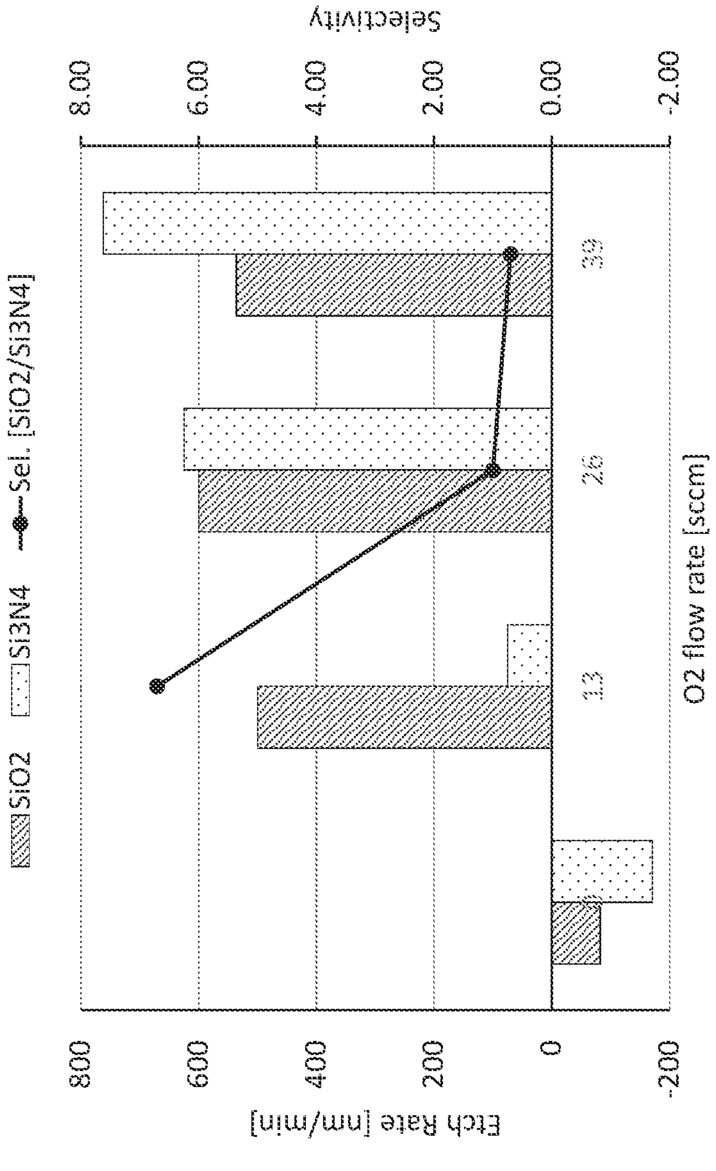
FIG. 4A is resulting etch rates of $SiO_2$ and $Si_3N_4$ and resulting selectivity of $SiO_2$ versus $Si_3N_4$ as a function of $O_2$ flow rate in Example 6.
Figure 4B:
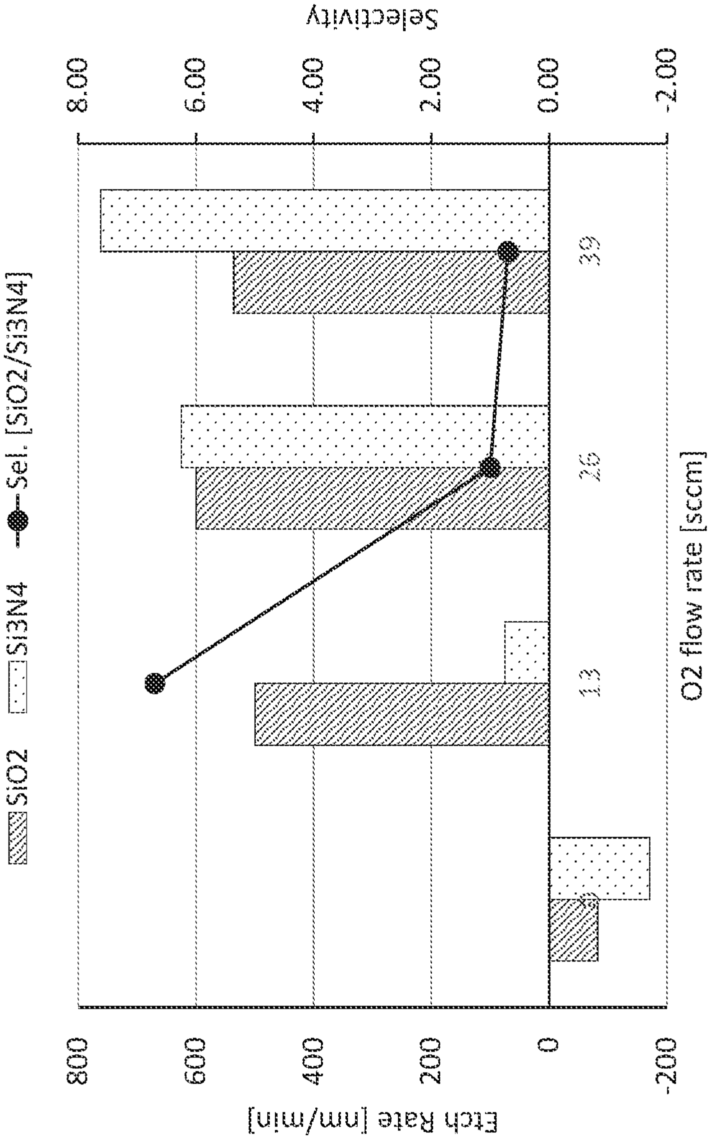
FIG. 4B is resulting etch rates of $SiO_2$ and $Si_3N_4$ and resulting selectivity of $SiO_2$ versus $Si_3N_4$ as a function of $O_2$ flow rate in Example 7.

Plasma etching was performed in a plasma etching chamber where power of 1400 W was applied to the top electrode at frequency of 60 MHz, power of 7000 W was applied to the bottom electrode at a frequency of the 2 MHz, power applied to both top and bottom electrode was pulsed at 500 Hz with duty cycle of 60%. Pressure in the chamber was maintained at 25 mTorr and gap between the electrodes was set at 20 mm. Following a gas mixture with defined gas flows was introduced to the plasma etching chamber: 150 sccm of Ar and, 65 sccm of $C_4H_4F_6O$ (Bis(2,2,2-trifluoroethyl) Ether, CAS: 333-36-8) and flow of $O_2$ varied in range between 52 and 91 sccm. Plasma etching process was carried out for 2 minutes. Resulting etch rates of $SiO_2$ and $Si_3N_4$ and selectivity of $SiO_2$/SiN as a function of $O_2$ flow are presented in FIG. 4D. The selectivity of $SiO_2/Si_3N_4$ as a function of $O_2$ flow can reach values close to 1, which is in a favorable range for ONON stack etching.

Example 10

Plasma etching was performed in a plasma etching chamber where power of 1400 W was applied to the top electrode at frequency of 60 MHz, power of 7000 W was applied to the bottom electrode at a frequency of the 2 MHz, power applied to both top and bottom electrode was pulsed at 500 Hz with duty cycle of 60%. Pressure in the chamber was maintained at 25 mTorr and gap between the electrodes was set at 20 mm. Following a gas mixture with defined gas flows was introduced to the plasma etching chamber: 150 sccm of Ar and, 65 sccm of $C_4H_4F_6O$ (1,1,2,3,3,3-Hexafluoropropyl methyl ether, CAS: 382-34-3) and flow of $O_2$ varied in range between 26 and 78 sccm. Plasma etching process was carried out for 2 minutes. Resulting etch rates of $SiO_2$ and $Si_3N_4$ and selectivity of $SiO_2$/SiN as a function of $O_2$ flow are presented in FIG. 4E. The selectivity of $SiO_2/Si_3N_4$ as a function of $O_2$ flow can reach values close to 1, which is in a favorable range for ONON stack etching.

It may be observed from FIG. 4A to FIG. 4E that in the case when $C_4H_2F_6O_2/Ar/O_2$ or $C_4H_4F_6O/Ar/O_2$ gas mixture is used as an etching gas it is possible to etch both $SiO_2$ and $Si_3N_4$ at higher etch rate comparing to $C_4H_2F_6/Ar/O_2$ etching gas mixture under identical conditions. As it was discussed before, higher etch rate may be attributed to two features of oxygen-containing hydrofluorocarbons: generation of oxygen containing fluorocarbon or hydrofluorocarbon reactive species and easier dissociation of molecule in plasma (in case of ether group present in the molecule). Formation of oxygen containing reactive species allows simultaneous delivery of O and F atoms to the etched surface and easy dissociation allows production of larger amount of reactive species, which combined allows to increase etch rate.

Figure 4C:
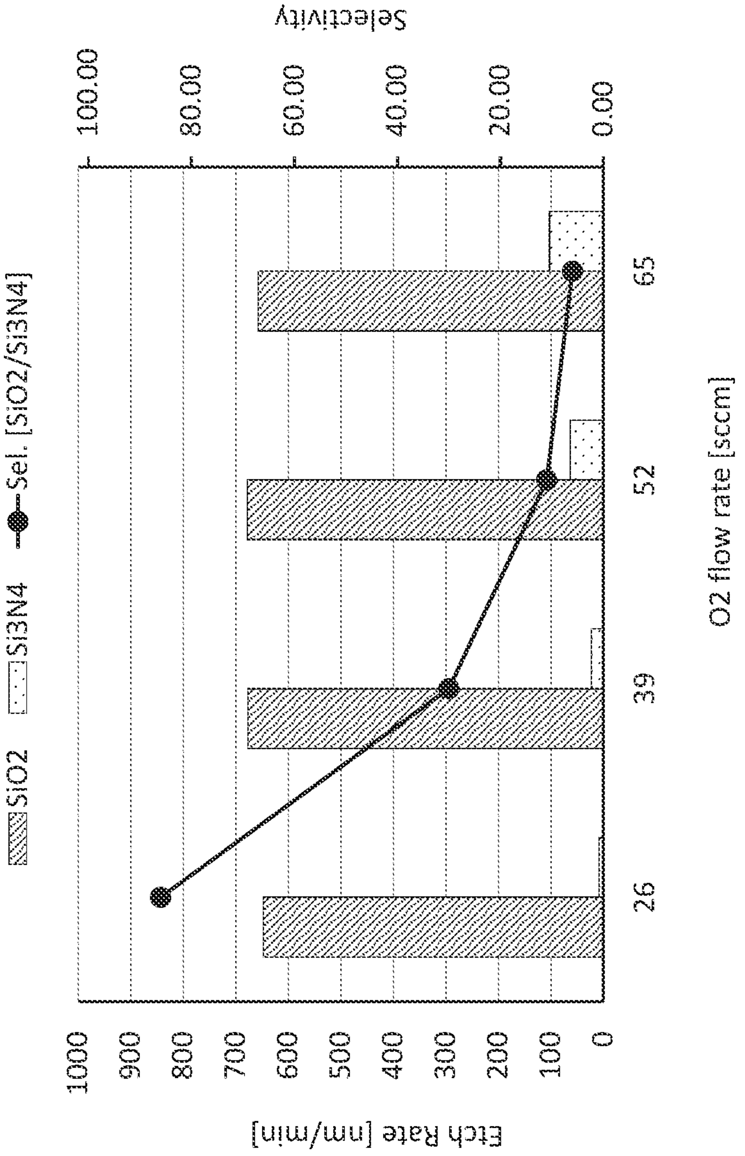
FIG. 4C is resulting etch rates of $SiO_2$ and $Si_3N_4$ and resulting selectivity of $SiO_2$ versus $Si_3N_4$ as a function of $O_2$ flow rate in Example 8.
Figure 4D:
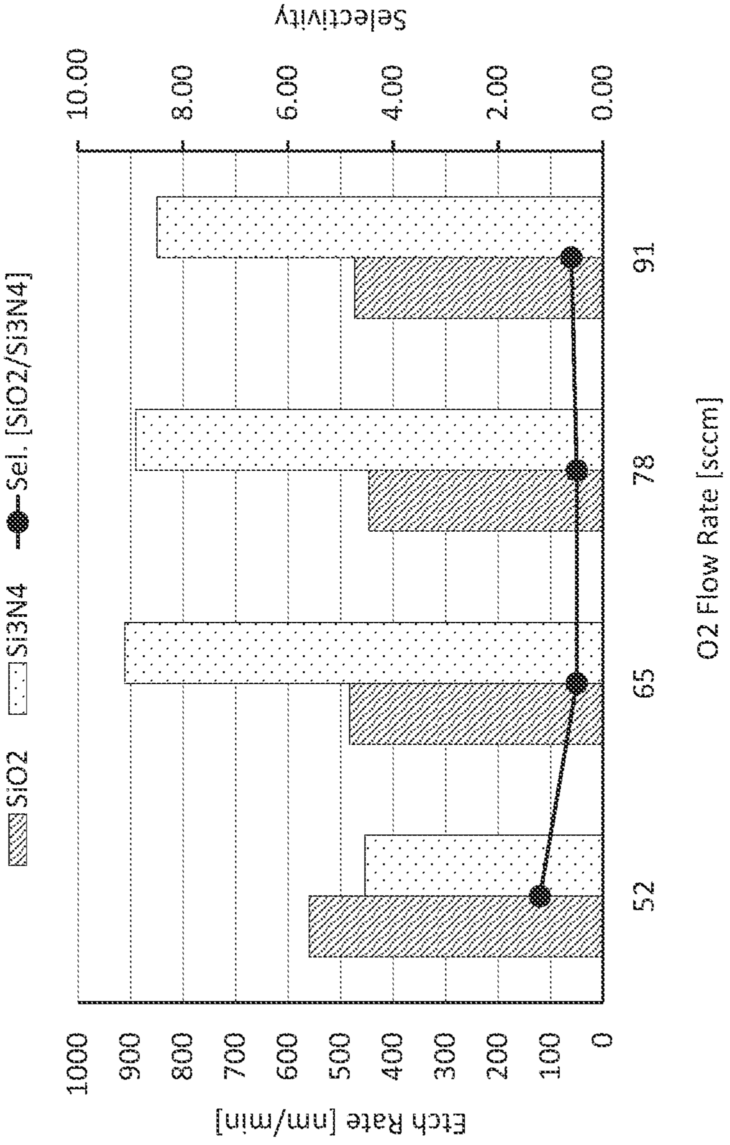
FIG. 4D is resulting etch rates of $SiO_2$ and $Si_3N_4$ and resulting selectivity of $SiO_2$ versus $Si_3N_4$ as a function of $O_2$ flow rate in Example 9.
Figure 4E:
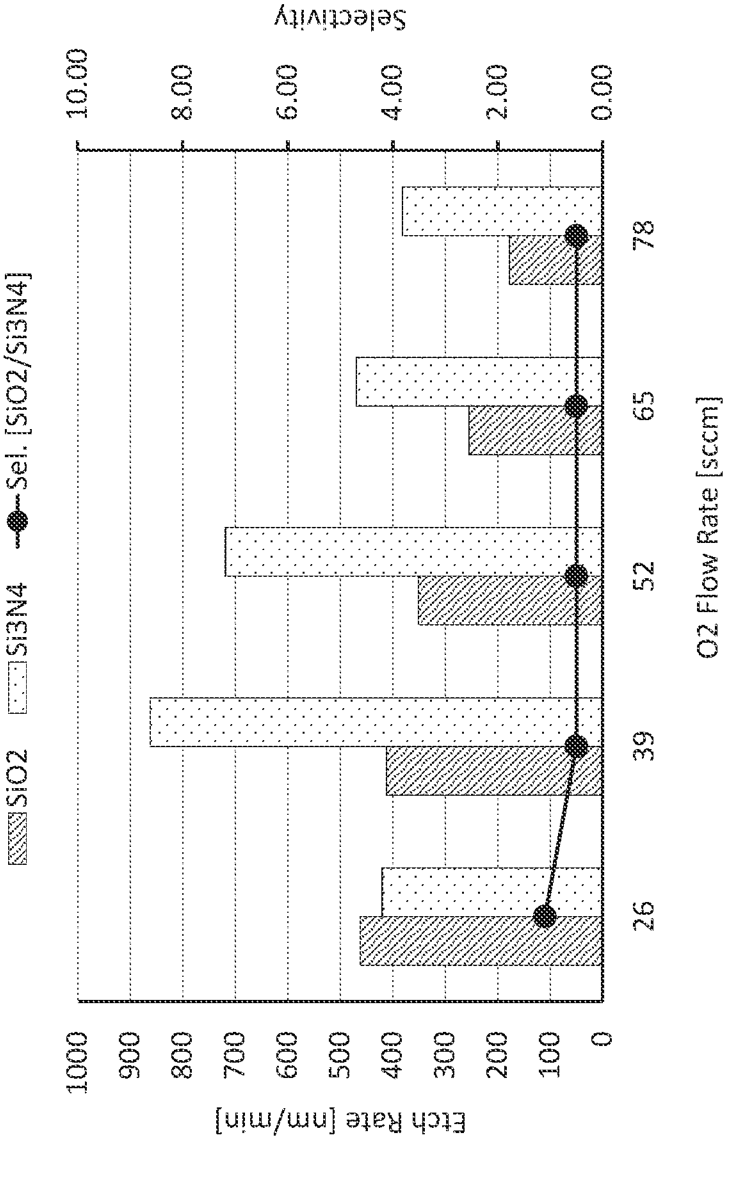
FIG. 4E is resulting etch rates of $SiO_2$ and $Si_3N_4$ and resulting selectivity of $SiO_2$ versus $Si_3N_4$ as a function of $O_2$ flow rate in Example 10.

On the other hand, it may be observed from FIG. 4C that despite higher etch rate of $SiO_2$ in case of $C_4F_8/Ar/O_2$ gas mixture comparing to $C_4H_2F_6O_2/Ar/O_2$, etch rate of $Si_3N_4$ was almost one order of magnitude lower comparing to $C_4H_2F_6O_2/Ar/O_2$ gas mixture under identical conditions. This clearly indicates that oxygen-containing hydrofluorocarbon may provide etching of both $SiO_2$ and $Si_3N_4$ at reasonable and comparable etch rate, which is not possible when only mixture of fluorocarbon and molecular oxygen is used as an etching gas.

Another important observation from FIG. 4A is that selectivity of etching $SiO_2$ to $Si_3N_4$ varies in a wide range with flow of $O_2$. That is, it is possible to etch preferentially $SiO_2$ at 13 sccm of $O_2$, etch both $SiO_2$ and $Si_3N_4$ at similar etch rate at 26 sccm of $O_2$, and preferentially etch $Si_3N_4$ at higher flow rate of $O_2$. Possibility of etching $SiO_2$ and $Si_3N_4$ at similar etch rate and variability of $SiO_2$ to $Si_3N_4$ etching selectivity with $O_2$ flow rate looks essential for ONON stack high aspect ratio etching (typically used in fabrication of DRAM) where precise control of both $SiO_2$ and $Si_3N_4$ etch rates is required to achieve vertical profile without profile distortion (such as scalloping) after etching.

From summarizing observations in Examples 1-5 it may be concluded that addition of oxygen-containing hydrofluorocarbon, preferably with at least one oxygen atom incorporated in ether group, and more preferably $C_4H_4F_6O$ or $C_4H_2F_6O_2$ to the Then a gas mixture allows to improve selectivity and preserve lateral dimensions of the structure during high aspect ratio etching, while also improving etch rate compared to mixture of hydrofluorocarbon and molecular $O_2$ gas. Additionally, it was confirmed that observed improvement of etch rate remains with increase of aspect ratio, which is essential for high aspect ratio etching process. On the other hand, from summarizing observations in Examples 6-8 it may be concluded that use of oxygen-containing fluorocarbon in an etching gas mixture allows more effective etching of $Si_3N_4$ comparing to commonly used fluorocarbon or hydrofluorocarbon gases under identical conditions. Moreover, it is possible to control selectivity of etching of $SiO_2$ to $Si_3N_4$ by changing $O_2$ flowrate when oxygen-containing hydrofluorocarbon used as an etching gas. It is observed in FIG. 4A, FIG. 4D and FIG. 4E with $O_2$ flowrate increasing, the selectivity of $SiO_2$ versus SiN was gradually reach to a range from 1:2 to 2:1, and gradually reach values close to 1. Considering a favorable range of selectivity, the disclosed oxygen-containing hydrofluorocarbons are able to apply to ONON stack etching. Therefore, vapor of oxygen-containing hydrofluorocarbon compounds looks promising as an etching gas or additive to an etching gas for high aspect ratio etching of Si-containing films ($SiO_2$, $Si_3N_4$ and ONON stack in particular) in fabrication of semiconductor devices (such as 3D NAND and DRAM) due to exceptional capabilities of etching profile control, high etch rate and selectivity and fine control over $SiO_2$ and $Si_3N_4$ etch rate.

Example 11

Plasma etching was performed in a plasma etching chamber where power of 1400 W was applied to the top electrode at frequency of 60 MHz, power of 7000 W was applied to the bottom electrode at a frequency of the 2 MHz, power applied to both top and bottom electrode was pulsed at 500 Hz with duty cycle of 60%. Pressure in the chamber was maintained at 25 mTorr and gap between the electrodes was set at 20 mm. Then a gas mixture including following flows of gases was introduced to the plasma etching chamber: 150 sccm of Ar, 71 sccm of $O_2$ and 65 sccm of $C_4H_4F_6O$ (Bis(2,2,2-trifluoroethyl) Ether, CAS: 333-36-8). Plasma etching process was carried out for 1 minute. Resulting structure of cross-section of the workpiece after the etching process observed by SEM (not shown), comparison results are summarized in Table 2.

Example 12

Plasma etching was performed in a plasma etching chamber where power of 1400 W was applied to the top electrode at frequency of 60 MHz, power of 7000 W was applied to the bottom electrode at a frequency of the 2 MHz, power applied to both top and bottom electrode was pulsed at 500 Hz with duty cycle of 60%. Pressure in the chamber was maintained at 25 mTorr and gap between the electrodes was set at 20 mm. Then, a gas mixture including following flows of gases was introduced to the plasma-etching chamber 150 sccm of Ar, 104 sccm of $O_2$ and 65 sccm of $C_4H_2F_6$. Plasma etching process was carried out for 1 minute. Resulting structure of cross-section of the workpiece after the etching process observed by SEM (not shown), comparison criteria are summarized in Table 2.

Data summarized in the Table 2 demonstrates comparison between $C_4H_4F_6O$ and $C_4H_2F_6$+$O_2$ gases to verify difference between addition of $O_2$ to the gas mixture and containing oxygen in the molecule, when the total flow of $O_2$ is the same. It may be clearly observed from Table 2 that incorporation of oxygen into molecule allows significant improvement in preservation of lateral dimensions of the structure. It may be explained by a decrease of isotropic etch rate caused by free oxygen radicals in the case of $C_4H_4F_6O$ due to lower $O_2$ rate. This correlates well with results observed in Table 1 for $C_4H_2F_6O_2$. Observed data demonstrates that it is possible to improve most of etched structure profile parameters (bow CD, top CD and neck CD) while maintaining infinite or high value of selectivity if oxygen is introduced into an etching gas mixture using oxygen-containing hydrofluorocarbon gas instead of molecular $O_2$ or introduced using combination of molecular $O_2$ and oxygen-containing hydrofluorocarbon gas.

Example 13

Plasma etching was performed in a plasma etching chamber where power of 1400 W was applied to the top electrode at frequency of 60 MHz, power of 7000 W was applied to the bottom electrode at a frequency of the 2 MHz, power applied to both top and bottom electrode was pulsed at 500 Hz with duty cycle of 60%. Pressure in the chamber was maintained at 25 mTorr and gap between the electrodes was set at 20 mm. Then a gas mixture including following flows of gases was introduced to the plasma-etching chamber: 150 sccm of Ar, 71 sccm of $O_2$, 20 sccm of $C_4F_6$ and 45 sccm of $C_4H_4F_6O$ (Bis(2,2,2-trifluoroethyl) Ether, CAS: 333-36-8). Plasma etching process was carried out for 3 minutes. Resulting structure of cross-section of the workpiece after the etching process observed by SEM (not shown), comparison criteria are summarized in Table 2.

Example 14

Plasma etching was performed in a plasma etching chamber where power of 1400 W was applied to the top electrode at frequency of 60 MHz, power of 7000 W was applied to the bottom electrode at a frequency of the 2 MHz, power applied to both top and bottom electrode was pulsed at 500 Hz with duty cycle of 60%. Pressure in the chamber was maintained at 25 mTorr and gap between the electrodes was set at 20 mm. Then a gas mixture including following flows of gases was introduced to the plasma-etching chamber 150 sccm of Ar, 104 sccm of $O_2$, 20 sccm of $C_4F_6$ and 45 sccm of $C_4F_6$. Plasma etching process was carried out for 3 minutes. Resulting structure of cross-section of the workpiece after the etching process observed by SEM (not shown), comparison criteria are summarized in Table 2.

Data summarized in Table 2 demonstrates comparison between $C_4H_4F_6O$ and $C_4F_6$ gases as a main etchant in Ar+$O_2$+$C_4F_6$ etching recipe. It may be clearly observed that $C_4H_4F_6O$ brings dramatic improvement in selectivity and structure profile control comparing to $C_4F_6$. Considering that total flow of 0 atoms to the chamber was the same in both examples, it indicates that bonding 0 into molecule allows improving selectivity and profile control by reduction of required molecular $O_2$ flow, which is correlating well with results observed in Examples 1 to 10.

Example 15

Plasma etching was performed in a plasma etching chamber where power of 1400 W was applied to the top electrode at frequency of 60 MHz, power of 7000 W was applied to the bottom electrode at a frequency of the 2 MHz, power applied to both top and bottom electrode was pulsed at 500 Hz with duty cycle of 60%. Pressure in the chamber was maintained at 25 mTorr and gap between the electrodes was set at 20 mm. Then a gas mixture including following flows of gases was introduced to the plasma-etching chamber: 150 sccm of Ar, 30 sccm of $O_2$ and 60 sccm of $C_4F_6$. Plasma etching process was carried out for 2 minutes. Resulting structure of cross-section of the workpiece after the etching process observed by SEM (not shown), comparison criteria are summarized in Table 2.

Example 16

Plasma etching was performed in a plasma etching chamber where power of 1400 W was applied to the top electrode at frequency of 60 MHz, power of 7000 W was applied to the bottom electrode at a frequency of the 2 MHz, power applied to both top and bottom electrode was pulsed at 500 Hz with duty cycle of 60%. Pressure in the chamber was maintained at 25 mTorr and gap between the electrodes was set at 20 mm. Then a gas mixture including following flows of gases was introduced to the plasma-etching chamber: 150 sccm of Ar, 30 sccm of $O_2$ and 60 sccm of $C_4F_6$ and 10 sccm of $C_4H_4F_6O$ (1,1,2,3,3,3-Hexafluoropropyl methyl ether, CAS: 382-34-3). The difference between Example 14 and Example 15 is, in Example 15, an addition of $C_4H_4F_6O$ was added to the gas mixture of Example 14 in which $C_4H_4F_6O$ acted as an additive gas. Plasma etching process was carried out for 2 minutes. Resulting structure of cross-section of the workpiece after the etching process observed by SEM (not shown), comparison criteria are summarized in Table 2.

Example 17

Plasma etching was performed in a plasma etching chamber where power of 1400 W was applied to the top electrode at frequency of 60 MHz, power of 7000 W was applied to the bottom electrode at a frequency of the 2 MHz, power applied to both top and bottom electrode was pulsed at 500 Hz with duty cycle of 60%. Pressure in the chamber was maintained at 25 mTorr and gap between the electrodes was set at 20 mm. Then a gas mixture including following flows of gases was introduced to the plasma-etching chamber: 150 sccm of Ar, 30 sccm of $O_2$ and 50 sccm of $C_4F_6$ and 10 sccm of $C_4H_4F_6O$ (1,1,2,3,3,3-Hexafluoropropyl methyl ether, CAS: 382-34-3). The difference between Example 14 and Example 16 is, in Example 16, $C_4F_6$ in the gas mixture used in Example 14 was partially replaced with the addition of $C_4H_4F_6O$, since the flow of $C_4F_6$ was reduced from 60 sccm to 50 sccm. Plasma etching process was carried out for 2 minutes. Resulting structure of cross-section of workpiece after the etching process observed by SEM (not shown), comparison criteria are summarized in Table 2.

As shown in Table 2, either addition of $C_4H_4F_6O$ to the gas mixture (Example 15) or partial replacement of $C_4F_6$ in the gas mixture by $C_4H_4F_6O$ (Example 16) comparing to Example 14 allows significant improvement of etched structure profile comparing to baseline recipe with $Ar+O_2+C_4F_6$ gas mixture (Example 14). From more detailed measurements presented in Table 2, it may be concluded that use of $C_4H_4F_6O$ as additive or partial replacement gas allows preservation of lateral dimensions and improvement in selectivity. As discussed above—improvement in selectivity may be attributed to generation of unique fragments by dissociation $C_4H_4F_6O$ comparing to standard chemistry ($Ar+O_2+C_4F_6$) and to production of larger number of reactive species due to easy etcher group dissociation, which allows deposition of polymer on the top of the mask and increase of selectivity. On the other hand, preservation of lateral dimension and reduction of bowing may be attributed to potentially lower sticking coefficient of fragments generated from $C_4H_4F_6O$ which allows more conformal polymer deposition and preservation of the sidewall.

tivity of etching of $SiO_2$ to $Si_3N_4$ by changing $O_2$ flowrate when the oxygen-containing hydrofluorocarbon used as an etching gas. Therefore, vapor of oxygen-containing hydrofluorocarbon compounds looks promising as an etching gas or additive to an etching gas for high aspect ratio etching of Si-containing films (e.g., $SiO_2$, $Si_3N_4$ and ONON stack) in fabrication of semiconductor devices, such as 3D NAND and DRAM, due to exceptional capabilities of etching profile control, high etch rate and selectivity and fine control over $SiO_2$ and $Si_3N_4$ etch rate.

Although the subject matter described herein may be described in the context of illustrative implementations to process one or more computing application features/operations for a computing application having user-interactive components the subject matter is not limited to these particular embodiments. Rather, the techniques described herein may be applied to any suitable type of user-interactive component execution management methods, systems, platforms, and/or apparatus.

Example 18

Plasma etching was performed in a plasma etching chamber where power of 1400 W was applied to the top electrode at frequency of 60 MHz, power of 7000 W was applied to the bottom electrode at a frequency of the 2 MHz, power applied to both top and bottom electrode was pulsed at 500 Hz with duty cycle of 60%. Pressure in the chamber was maintained at 25 mTorr and gap between the electrodes was set at 20 mm. A process gas mixture including following flows of gases was introduced to the plasma-etching chamber 150 sccm of Ar, 32.5 sccm of $O_2$ and 65 sccm of $C_3H_2F_6O$. Plasma etching process was carried out for 1 minute. Resulting the structure of cross-section of the workpiece after the etching process observed by SEM (not shown), comparison results are summarized in Table 3.

TABLE 2

Summary of compared values for Examples 11 to17

| Example | Main etching gas | $SiO_2$ ER (nm/min) | a-C ER (nm/min) | Selectivity ($SiO_2$/a-C) | Neck CD (nm) | Top CD (nm) | Bow CD (nm) |
|---|---|---|---|---|---|---|---|
| 11 | $Ar + O_2 + C_4H_4F_6O_2$ | 405 | −89 | ∞ | 153 | 144 | 144 |
| 12 | $Ar + O_2 + C_4H_2F_6$ | 507 | 25 | 20 | 127 | 126 | 126 |
| 13 | $Ar + O_2 + C_4H_4F_6O + C_4F_6$ | 411 | 25 | 17 | 128 | 145 | 152 |
| 14 | $Ar + O_2 + C_4F_8 + C_4F_6$ | 626 | 256 | 2 | 190 | 200 | 222 |
| 15 | $Ar + O_2 + C_4F_8$ | 695 | 94 | 7.3 | 115 | 140 | 145 |
| 16 | $Ar + O_2 + C_4F_8 + C_4H_4F_6O$ ($C_4H_4F_6O$ added to gas mixture of Example 15) | 612 | 18 | 34 | 97 | 125 | 125 |
| 17 | $Ar + O_2 + C_4F_8 + C_4H_4F_6O$ ($C_4H_4F_6O$ partially replacing $C_4F_8$ in gas mixture of Example 15) | 620 | 42 | 26 | 115 | 135 | 135 |

From summarizing observations in Examples 1-5 and 11-17 it may be concluded that addition of oxygen-containing hydrofluorocarbon, preferably with at least one oxygen atom incorporated in ether group, and more preferably $C_4H_4F_6O$ or $C_4H_2F_6O_2$ to a process gas mixture allows to improve selectivity and preserve lateral dimensions of the structure during high aspect ratio etching, while also improving etch rate compared to mixture of hydrofluorocarbon and molecular $O_2$ gas. Additionally, it is confirmed that observed improvement of etch rate remains with increase of aspect ratio, which is essential for high aspect ratio etching process. Positive effect is verified in various gas mixtures such as $Ar/O_2/C_4F_6$, $Ar/O_2/C_4F_8$ or $Ar/O_2$ when oxygen containing hydrofluorocarbon gas was used as either main etchant, additive or replacement gas. On the other hand, from summarizing observations in Examples 6 to 9 it may be concluded that use of oxygen-containing hydrofluorocarbon in an etching gas mixture allows more effective etching of $Si_3N_4$ comparing to commonly used fluorocarbon or hydrofluorocarbon gases under identical conditions, which may be explained by easy dissociation of molecule on the ether group resulting in generation of large number of reactive species. Moreover, it is possible to control selec- Example 19

Plasma etching was performed in the same way as in Example A, with exception that process gas mixture was replaced by the following: 150 sccm of Ar, 65 sccm of $O_2$ and 65 sccm of $C_3H_2F_6$. Resulting the structure of cross-section of the workpiece after the etching process observed by SEM (not shown), comparison results are summarized in Table 3.

TABLE 3

| Summary of compared values for Examples 18 to 19 | | | | | | |
|---|---|---|---|---|---|---|
| Example | Main etching gas | $SiO_2$ ER (nm/min) | a-C ER (nm/min) | Selectivity ($SiO_2$/a-C) | Neck CD (nm) | TOP CD (nm) |
| 18 | $C_3H_2F_6O + O_2$ | 474 | 32 | 15 | 173 | 135 |
| 19 | $C_3H_2F_6 + O_2$ | 358 | 37 | 10 | 187 | 159 |

It is clearly noted from the Table 3 that $C_3H_2F_6O+O_2$ gas mixture provides much better results compared to $C_3H_2F_6$+$O_2$ gas mixture in all of comparison parameters ($SiO_2$ etch rate, selectivity, neck CD and top CD). Considering that atomic flow of elements (Ar, O, C, F and H) was kept the same and only difference between Examples 18 and 19 was incorporation of oxygen into molecule $C_3H_2F_6O$ in Example 18, it further proofs that the use of oxygen-containing hydrofluorocarbons and the use of $C_3H_2F_6O$ in particular allows to improve etching performance for all of the critical parameters.

It will be understood that many additional changes in the details, materials, steps, and arrangement of parts, which have been herein described and illustrated in order to explain the nature of the invention, may be made by those skilled in the art within the principle and scope of the invention as expressed in the appended claims. Thus, the present invention is not intended to be limited to the specific embodiments in the examples given above and/or the attached drawings.

While embodiments of this invention have been shown and described, modifications thereof may be made by one skilled in the art without departing from the spirit or teaching of this invention. The embodiments described herein are exemplary only and not limiting. Many variations and modifications of the composition and method are possible and within the scope of the invention. Accordingly, the scope of protection is not limited to the embodiments described herein, but is only limited by the claims which follow, the scope of which shall include all equivalents of the subject matter of the claims.

What is claimed is:

1. An etching method for forming an aperture by selectively etching one or more silicon-containing films in a substrate using a patterned mask layer deposited on top of the one or more silicon-containing films, the method comprising:

mounting the substrate in a processing chamber;

introducing an etching gas containing a vapor of an oxygen-containing hydrofluorocarbon into the processing chamber;

converting the etching gas to a plasma; and allowing an etching reaction to proceed between the plasma and the one or more silicon-containing films so that the one or more silicon-containing films are selectively etched versus the patterned mask layer to form the aperture, wherein the oxygen-containing hydrofluorocarbon has a general formula $C_xH_yF_zO_n$, where $2 \le x \le 13$, $1 \le y \le 15$, $1 \le z \le 21$, $1 \le n \le 3$, provided that when x=4, y≠3, z≠7 and n≠1, wherein the oxygen-containing hydrofluorocarbon has at least one ether group represented by one of following formulas:

$R_1$—CO—O—$CH_2$—$R_1$, $R_2$—$CH_2$—O—$CH_2$—$R_2$ or

-continued $R_3$—CHF—O—$CF_2$—$R_1$, wherein $R_1$ is H, F, $C_xH_{2x+2-z}F_z$ or $C_xF_{2x+2}$; $R_2$ is H, $C_xH_{2x+2-z}F_z$ or $C_xF_{2x+2}$; $R_3$ is F, $C_xH_{2x+2-z}F_z$ or $C_xF_{2x+2}$, where $2 \le x \le 3$ and $1 \le z \le 3$.

2. The method of claim 1, wherein the oxygen-containing hydrofluorocarbon contains at least one oxygen atom in an ether group or in a carbonyl group.

3. The method of claim 1, wherein the oxygen-containing hydrofluorocarbon is selected from $C_4H_2F_6O_2$, $C_3H_2F_6O$, $C_2H_2F_4O$, $C_2HF_3O$, $C_3H_5F_3O$, $C_2H_4F_2O$, $C_5H_4F_8O$, $C_5HF_{11}O$, $C_2H_3F_3O$, or their isomers.

4. The method of claim 1, wherein the oxygen-containing hydrofluorocarbon is $C_3H_2F_6O$ or its isomers.

5. The method of claim 1, wherein the oxygen-containing hydrofluorocarbon is $C_3H_2F_6O$ (CAS No: 57041-67-5).

6. The method of claim 1, wherein the oxygen-containing hydrofluorocarbon is $C_3H_2F_6O$ (CAS No: 84011-06-3).

7. The method of claim 1, wherein the oxygen-containing hydrofluorocarbon is $C_3H_2F_6O$ (CAS No: 920-66-1).

8. The method of claim 1, wherein the etching gas further includes a vapor of a fluorocarbon or hydrofluorocarbon selected from $CF_4$, $C_2F_6$, $C_3F_6$, $C_4F_6$, $C_4F_8$, $C_5F_8$, $C_5F_{10}$, $C_6F_{12}$, $C_7F_{14}$, $C_8F_{16}$, $CH_2F_2$, $CH_3F$, $CHF_3$, $C_5HF_7$, $C_3H_2F_6$, $C_3H_4F_2$, $C_3F_2H_4$, $C_4H_2F_6$, $C_4H_3F_7$, $C_3HF_4N$, $CF_3I$, $C_3F_7I$, $C_4F_9I$, $C_4H_9F_3Si$, $C_5H_9F_5Si$ or combinations thereof.

9. The method of claim 1, wherein the etching gas further includes an oxidizing gas selected from $O_2$, $O_3$, CO, $CO_2$, SO, $SO_2$, FNO, $N_2$, NO, $N_2O$, $NO_2$, $H_2O$, COS or combinations thereof.

10. The method of claim 1, wherein the etching gas further includes an inert gas selected from He, Ar, Xe, Kr or Ne.

11. The method of claim 10, wherein a selectivity of the silicon oxide film versus the silicon nitride film in the layer of ONON films ranges from 1:5 to 5:1.

12. The method of claim 1, wherein the etching gas further includes an additional gas selected from $H_2$, $SF_6$, $NF_3$, $N_2$, $NH_3$, $Cl_2$, $BCl_3$, $Br_2$, $F_2$, HBr, HCl, $PF_3$ or combinations thereof.

13. The method of claim 1, wherein an aspect ratio of the aperture is above 5.

14. The method of claim 1, wherein the one or more silicon-containing films comprise a layer of $Si_aO_bH_cC_dN_e$, where a >0, b, c, d and e≥0, selected from silicon oxide, silicon nitride, crystalline Si, poly-silicon, amorphous silicon, low-k SiCOH, SiOCN, SiC, SiON, or a layer of alternating silicon oxide and silicon nitride (ONON) films or alternating silicon oxide and poly-silicon (OPOP) films.

15. An etching method for forming an aperture by selectively etching a silicon-containing film in a substrate using a patterned mask layer deposited on top of the silicon oxide film or the, the method comprising:

mounting the substrate in a processing chamber;

introducing an etching gas containing an oxygen-containing hydrofluorocarbon $C_3H_2F_6O$ vapor into the processing chamber;

converting the etching gas to a plasma; and allowing an etching reaction to proceed between the plasma and the silicon-containing film so that the silicon-containing film is selectively etched versus the patterned mask layer to form the aperture.

16. The method of claim 15, wherein the oxygen-containing hydrofluorocarbon is $C_3H_2F_6O$ or its isomers.

17. The method of claim 15, wherein the oxygen-containing hydrofluorocarbon is $C_3H_2F_6O$ (CAS No: 57041-67-5).

18. The method of claim 15, wherein the oxygen-containing hydrofluorocarbon is $C_3H_2F_6O$ (CAS No: 84011-06-3).

19. The method of claim 15, wherein the oxygen-containing hydrofluorocarbon is $C_3H_2F_6O$ (CAS No: 920-66-1).

20. The method of claim 15, wherein the etching gas further includes a vapor of a fluorocarbon or hydrofluorocarbon selected from $CF_4$, $C_2F_6$, $C_3F_6$, $C_4F_6$, $C_4F_8$, $C_5F_8$, $C_5F_{10}$, $C_6F_{12}$, $C_7F_{14}$, $C_8F_{16}$, $CH_2F_2$, $CH_3F$, $CHF_3$, $CHF_7$, $C_3H_2F_6$, $C_3H_4F_2$, $C_3F_2H_4$, $C_4H_2F_6$, $C_4H_3F_7$, $C_3HF_4N$, $CF_3I$, $C_3F_7I$, $C_4FoI$, $C_4H_9F_3Si$, $C_5H_9F_5Si$ or combinations thereof.

21. The method of claim 15, wherein the etching gas further includes an oxidizing gas selected from $O_2$, $O_3$, CO, $CO_2$, SO, $SO_2$, FNO, $N_2$, NO, $N_2O$, $NO_2$, $H_2O$, COS or combinations thereof.

22. The method of claim 15, wherein the etching gas further includes an inert gas selected from He, Ar, Xe, Kr or Ne.

23. The method of claim 15, wherein the etching gas further includes an additional gas selected from $H_2$, $SF_6$, $NF_3$, $N_2$, $NH_3$, $Cl_2$, $BCl_3$, $Br_2$, $F_2$, HBr, HCl, $PF_3$ or combinations thereof.

24. The method of claim 15, wherein an aspect ratio of the aperture is above 5.

25. The method of claim 15, wherein the silicon-containing film is a silicon oxide film, or a silicon nitride film.

* * * * *